(12) United States Patent
Ananth

(10) Patent No.: US 6,205,197 B1
(45) Date of Patent: Mar. 20, 2001

(54) PROGRAMMABLE SUPERVISORY CIRCUIT AND APPLICATIONS THEREFOR

(75) Inventor: Ravi S. Ananth, Ancaster (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/320,217

(22) Filed: May 26, 1999

Related U.S. Application Data

(62) Division of application No. 08/773,020, filed on Oct. 16, 1996, now abandoned.

(30) Foreign Application Priority Data

Dec. 28, 1995 (CA) .................................................. 2166247

(51) Int. Cl.$^7$ ....................................................... G07C 3/00
(52) U.S. Cl. .................................. 377/16; 377/45; 377/54
(58) Field of Search .................................... 377/45, 54, 16

(56) References Cited

U.S. PATENT DOCUMENTS

| | | | |
|---|---|---|---|
| 3,705,297 | * 12/1972 | John .......................................... | 708/3 |
| 3,936,663 | * 2/1976 | Taylor et al. ........................... | 708/445 |
| 4,054,786 | * 10/1977 | Vincent .................................. | 702/199 |
| 4,077,061 | 2/1978 | Johnston et al. ...................... | 364/483 |
| 4,282,576 | 8/1981 | Elms et al. ............................. | 364/483 |
| 4,612,617 | 9/1986 | Laplace, Jr. et al. ................. | 364/483 |
| 5,248,967 | 9/1993 | Daneshfar ............................. | 340/931 |
| 5,345,409 | 9/1994 | McGrath et al. ...................... | 364/736 |

* cited by examiner

*Primary Examiner*—Margaret R. Wambach
(74) *Attorney, Agent, or Firm*—Joscelyn G. Cockburn

(57) ABSTRACT

The invention herein provides a supervisory circuit which is adapted to monitor an input signal and produce as an output signal, a parametric signal corresponding to the input signal. The circuit includes an input for receiving the input signal, and a stochastic processor coupled to the input for receiving the input signal and processing it to derive a signal that represents a parametric measure of the input signal. An output connected to said stochastic processor provides the parametric output signal as an output for supervisory purposes.

1 Claim, 26 Drawing Sheets

IN PROBABILISTIC TERMS:
P(X,Y) = P(X1Y) P(Y) = P(X) P(Y) IF X AND Y ARE INDEPENDENT

N-BIT PARALLEL OUTPUT

COUNTER OUTPUT = $\frac{1}{2n} \sum_{i}^{k} (X_i - Y_i)$ (NORMALIZED)

RANDOMIZER (PARALLEL IN/SERIAL OUT)

RANDOMIZER (PARALLEL IN/SERIAL OUT)

DSM RESPONSE　　　　　RUNNING-AVERAGER RESPONSE

RANDOMIZER (PARALLEL IN/SERIAL OUT)

Φ₁,Φ₂ ARE NON-OVERLAPPING CLOCKS

PROGRAMMABLE SUPERVISORY CIRCUIT AND APPLICATIONS THEREFOR

This application is a divisional of Ser. No. 08/773,020, filed Oct. 16, 1996 now abandoned.

FIELD OF THE INVENTION

This invention relates to supervisory circuits for the measurement of low frequency signals and control of power supplies.

BACKGROUND OF THE INVENTION

Electrical measurement metering in power management has been traditionally carried out by analog devices while the electronics industry has been basically converted from analog devices to digital devices primarily computers and other electronic digital apparatus. In keeping with the development of the electronic field it is important that electronic devices such as power management devices be reduced to very small size but still maintain increased flexibility to improve turnaround time in manufacturing so that a basic circuit design can be used in many different devices with only minor modification or reprogramming at the most to fulfill the new function or provide the new voltage or power levels desired.

The need for reliable power supplies has become increasingly important as circuit densities and hence functionality of the various systems powered by these power supplies continue to rise. Unforeseen failure of power supplies in a computer system, for example would be catastrophic, as it can result in the loss of valuable data. As a result, constant supervision or monitoring of the power supply is required and this has made it necessary to include specialized power supervisory circuits within such systems. These supervisory circuits keep the over all system informed about the integrity of the power supply and hence allows for the safe shutdown of the dependent systems in case this integrity is breached.

Generally, supervisory circuits monitor the voltage or current levels of analog voltages or currents and inform the system on whether the signals are within the allowed range of operation. The operating range is fairly large (typically +/−10% of a pre-specified value) and hence, the resolution required to monitor the signal is not too demanding with a +/−2% full-scale resolution being sufficient. Furthermore, the monitored signals have low bandwidths since they are usually the dc output voltage (current) or ac-line input voltage (current) of the power supply. A supervisory circuit, however, may be required to monitor a number of signals simultaneously as a mixed analog-digital system may operate off a number of different voltage levels. Existing power-supervisory applications specific integrated circuits (PS-ASIC) are primarily analog in nature and function sufficiently well in this context. These PS-ASICs, however, are found to be inflexible to changes in component tolerance values that occur during the manufacturing process and are fixed in their signal processing operations once they are set into the product. It would be advantageous therefore to have a PS-ASIC that would accommodate drifts in threshold values due to aging, product upgrades during the lifetime of a product, and alteration of the signal processing capabilities of the PS-ASIC.

Such a PS-ASIC would be "reconfigurable" or field upgradeable and also make possible the use of a single PS-ASIC in a wide range of similar products thereby reducing development costs and time to market.

Until recently, analog based circuit techniques were used for signal processing. These circuits were implemented in bipolar technology and required the use of accurate voltage and current sources as well as precision resistor divider networks for every parametric threshold detection routine used. This was area intensive and due to the drifts that occurred in the references it was also found to be prone to failure in terms of meeting operating specifications. Furthermore, the advent of switched-mode power supplies introduced the ASIC to noisier operating environments making it even more prone to false threshold detection problems. Masking times for threshold faults were achieved by the use of external components (to set RC time constants) which made the PS-ASIC once again susceptible to component tolerance problems. As far as more complex computation were concerned, they all basically relied on obtaining the average time that a waveform (such as the ac line voltage) exceeded a certain threshold value before the resulting average would trip a parametric test. Hence, the computational complexity of these circuits was limited. Finally, the ASIC was fixed in terms of its application to a specific product and hence was not flexible to operate on updated specifications on the same product or other products. These problems have thus made the use of present implementation techniques unattractive.

Switched capacitor circuit techniques make it possible to design programmable mixed analog-digital circuits. For example, a "programmable capacitor array" (PCA) used in an amplifier feedback can result in programmable gains that are controlled by digital co-efficients. PCA's can be used in comparator circuits to obtain programmable trip points by distributing the charge in the PCA to attain the desired threshold voltage. This technique can give a fair degree of programmability in terms of some basic signal processing. However, using PCAs as the primary implementation technique can be expensive in terms of an ASIC layout. For example, an eight bit resolution would require a capacitance spread, (Cmax/Cmin) of 256. Since very small capacitors are undesirable due to increased noise (kT/C noise) and mask resolution inaccuracies and in addition need to be at least an order of magnitude greater than the parasitic capacitance within the circuit (the gate-to-source capacitance of a minimum size CMOS transistor in a typical 1.2 micro-meters CMOS process is 20 Femtoferads (fF)) one is limited in the maximum value of capacitance chosen. For a Cmin of 200 fF, a Cmax/Cmin of 256 would give a Cmax of 51 pF. Given that in a typical 1.2 micro-meter CMOS process, 1 pF occupies approximately 1290 micro-meter$^2$ this makes Cmax alone occupy 66,000 micro-meters$^2$ (approximately 102 mil$^2$). One can see that area requirements may become quite demanding for an implementation that requires a number of such switched capacitor configurations.

U.S. Pat. No. 5,345,409 makes use of digital signal processors (DSPs) and is incorporated herein by reference. Digital signal processors have gained widespread use in a number of applications including power monitoring as can be seen by the above reference. They are capable of computationally intensive tasks and are programmable by software. The reference discloses a programmable power metering ASIC comprised of a mixed analog-digital circuit that uses a customized DSP for computations. Six Delta-Sigma analog to digital converters are used to provide an oversampled serial bit-stream of information from the six source signals (three in voltage mode and three in current mode). This information is low pass filtered and decimated using digital filtering techniques. The resulting output is fed to the DSP which has two programmable processors that are used to execute calibration and computing operations using the algorithms stored in and off-chip PROM. This allows the ASIC to compute the RMS values, real and apparent power consumptions and power factor rating of the source signals. The final readings are measured to give an absolute accuracy of 0.04% when using the calibration coefficients. The performance of this implementation comes at the expense of silicon die area. The ASIC corresponding to the structure disclosed in the reference occupies about 6.4 mm×7.1 mm in 1.5 micro-meter CMOS technology (most of which is occupied by the DSP) in order to monitor six signals.

One of the objectives of the present invention is to provide sufficient signal processing capability while minimizing the amount of silicon die area required in order to reduce cost and still provide the necessary function.

The invention described herein provides a moderately accurate (less than 2% full-scale error) programmable supervisory circuit that can monitor a number of critical low frequency signals in a complex power supply by applying stochastic and pulse density based computational techniques.

Stochastic computing techniques were developed in the mid-sixties in an effort to obtain parallel computing structures for neural networks. Stochastic computing relies on principles based on Boolean algebra and probabilistic mathematics. Analog quantities are represented in terms of a probabilistic digital bit-stream and the resulting hardware needed for signal processing becomes very simple in comparison to that required by conventional digital or analog methodologies. This hardware simplicity comes at the expense of computational accuracy but the desired operating specification for a supervisory circuit can still be easily met. Furthermore, the implementation in digital circuitry gives it an advantage over analog implementations since it means better noise immunity (important in switch mode power supplies) and easier testability. Most importantly, it also allows the circuit to be reconfigurable when field-programmable gate array technology is used. The encoding of the analog signal can be done by using Delta-Sigma Modulation (DSM) to obtain a highly oversampled serial pulse density modulated digital bit-stream. This encoded representation of the analog signal can then be processed by a stochastic computer. Delta-Sigma modulation can be used to simplify digital filter structures by providing an alternative way to multiply digital filter coefficients in a filter. This is used to advantage in one aspect of the invention in order to implement one aspect of the supervisory function.

The invention herein provides a power supervisory circuit and attendant applications which together provide simplicity, robustness and programmability with the integration of stochastic and DSM based computations to perform threshold, means squared and RMS outputs which can be used to control power supplies or for monitoring purposes.

SUMMARY OF THE INVENTION

The invention herein provides a supervisory circuit which is adapted to monitor an input signal and produce as an output signal, a parametric signal corresponding to the input signal. The circuit includes an input for receiving the input signal, and a stochastic processor coupled to the input for receiving the input signal and processing it to derive a signal that represents a parametric measure of the input signal. An output connected to said stochastic processor provides the parametric output signal as an output for supervisory purposes.

Typically the input signal is an analog voltage and the stochastic processor is adapted to produce an output voltage signal which is proportional to the RMS value of the voltage of the input signal.

The supervisory circuit may preferably comprise an input for receiving the input signal, a mean square processor for determining the mean square value of the input voltage; a conversion processor for converting the mean square value into a random pulse density modulated bitstream representative of the mean square value; a stochastic processor conversion processor for converting the random pulse density modulated bitstream into a stochastic representation of the RMS value of the input voltage, and an output for outputting the stochastic representation of the RMS value.

An embodiment of the supervisory circuit for deriving a parametric output signal of an analog input signal may comprise an input delta-sigma analog to digital converter adapted to produce a serial pulse density modulated bit stream representation of the analog input signal, a running averager processor adapted to process the bit stream representation of the analog input signal to produce a representation of the running average of the bitstream; a multi bit modulated squarer processor adapted to calculate the square of the running average and integrate the square over a suitable time period to derive a parallel binary representation of the mean square value of the analog input signal; a randomizer adapted to convert the binary representation of the mean square value of the analog input signal to a serial random pulse density modulated bitstream; a stochastic square root processor adapted to process the random pulse density modulated bitstream to produce a parametric signal corresponding the root mean square value of the analog input signal; and, output means to output said root mean square value signal.

In another embodiment the stochastic square root processor is adapted to accept the serial random pulse density modulated bitstream as input and uses as negative feedback the stochastic square of the output of the stochastic processor to produce an output corresponding to the root mean square value of the analog input signal.

The running averager processor may be adapted to process the serial bit stream representation of the analog input signal to produce a parallel representation of the running average of the bitstream.

Preferably, the multi bit modulated squarer processor is adapted to calculate the square of the running average by modulating the average by the serial pulse density modulated bitstream representation of the analog input signal to obtain a multi bit representation of the analog input signal squared, and integrate the square over the period of the input signal or a suitable timer period to derive a parallel binary representation of the mean square value of the analog input signal.

The stochastic square root processor may include:

a) an up down counter having incrementing and decrementing inputs, and an output, and being adapted to receive the random pulse density modulated bitstream at the incrementing input, the output signal of the counter being converted by a randomizer to an output random pulse density modulated bitstream, b) a feedback circuit, the output bitstream being further modified by the feedback circuit to provide a decrementing input to the counter, the feedback circuit comprising:

i) a decorrelator to decorrelate the output bitstream; and, ii) means to feed back the boolean product of the output bitstream and the decorrelated bitstream (obtaining a squared representation of output value of the counter) to the decrementing input of the counter, the output signal of the counter representing the square root of the mean square input, thereby producing a parametric signal which corresponds to the root mean square value of the analog input signal.

The supervisory circuit may further include a threshold status apparatus adapted to respond to a signal derived by a processor of the supervisory circuit to produce a threshold status output when the signal is within a preselected range of values. The threshold status apparatus may preferably be adapted to respond to the signal when the signal is within any of acceptable, unacceptable, or marginal range of conditions.

The threshold status apparatus may be adapted to respond to the root mean square value output of the supervisory circuit, or the output signal of any of the processors of the supervisory circuit may be made available externally.

Another aspect of the invention provides a power supply which includes a power convertor for converting an input into a regulated output, and a supervisory circuit for supervising the power convertor. The power convertor is governed by the supervisory circuit, the supervisory circuit providing an output control signal to the power convertor which is derived from stochastic processing of an analog input signal corresponding to the input to the power supply.

BRIEF DESCRIPTION OF THE DRAWINGS

The invention herein is depicted in its various embodiments in the drawings of which.

DETAILED DESCRIPTION OF THE INVENTION

Figure 1:
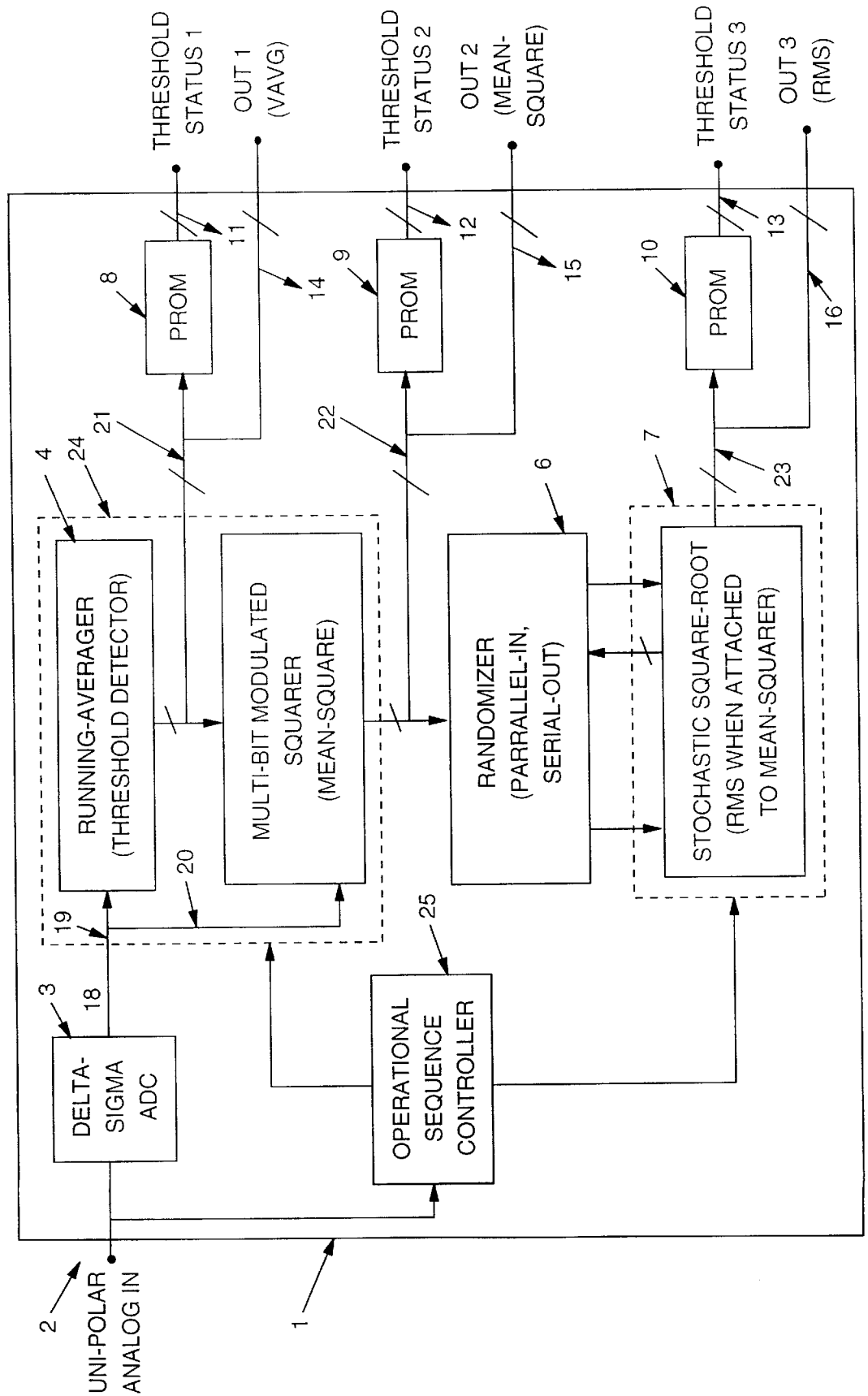
FIG. 1 depicts a configuration of one embodiment of the supervisory circuit of the invention employing a delta-sigma ADC.
Figure 2:
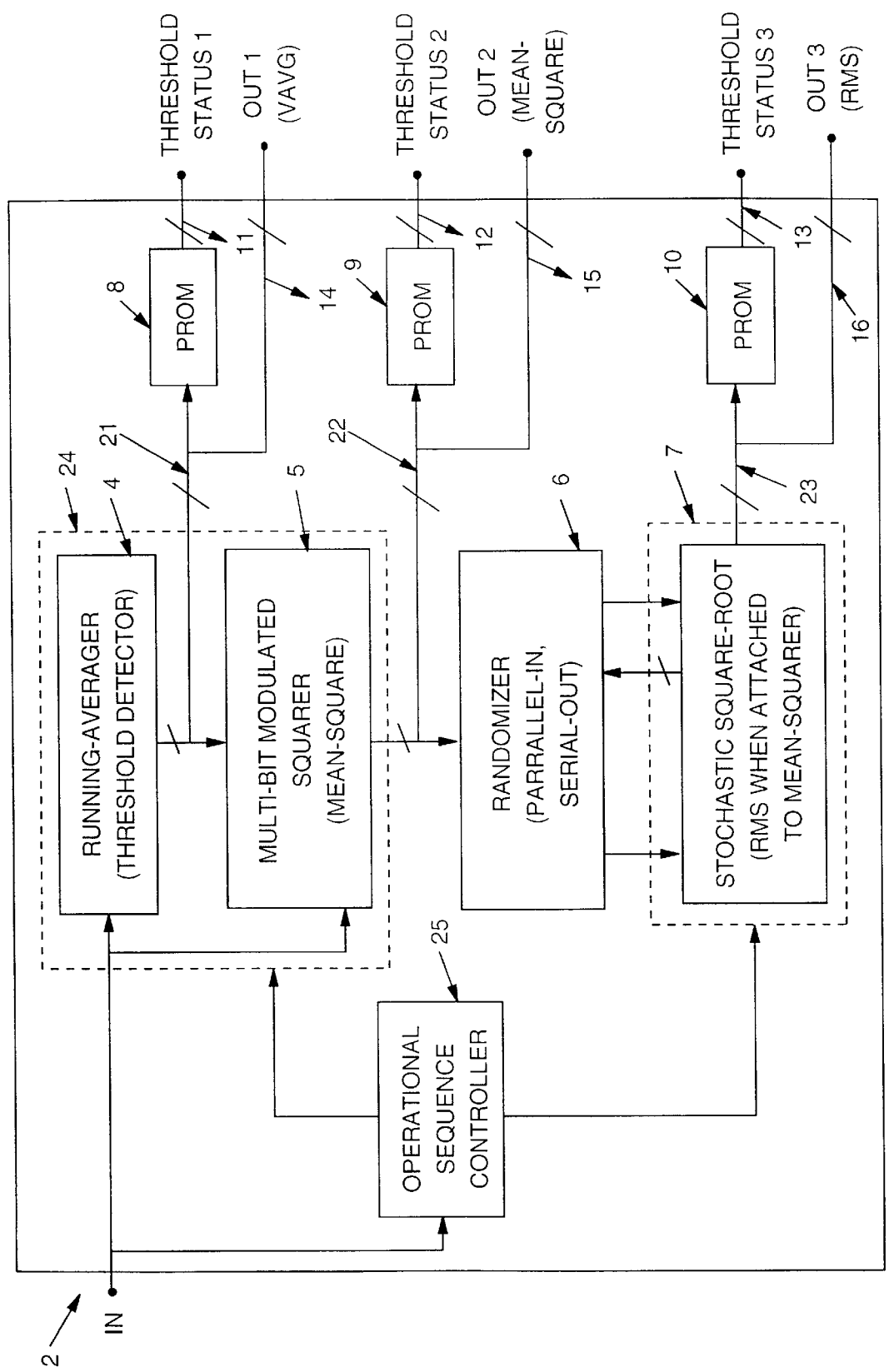
FIG. 2 depicts a similar configuration without said ADC for use with digital signals.

Referring to FIG. 1 which depicts one implementation of a supervisory circuit 1 in accordance with this invention. The circuit is adapted to receive at input 2 an analog input signal (a voltage of unipolar nature in this case). Delta sigma modulator 3 provides analog to digital conversion of the input, the digital output which is in the form of a pulse density modulated serial bit stream corresponding to the level of the input signal. Running Averager 4, further described later, and its associated circuitry is adapted to provide a running average Vavg 14 of the signal output on line 18 from the Delta Sigma Modulator 3 and also a threshold status signal 11. The running average information which is in parallel binary form can be used to provide output information at Output 1, also to address a threshold circuit, e.g. PROM 8 to provide a threshold status signal 11. The PROM 8 may advantageously be programmed with user specified values corresponding to satisfactory and unsatisfactory levels to provide go, no-go, and standby signals.

Figure 3:
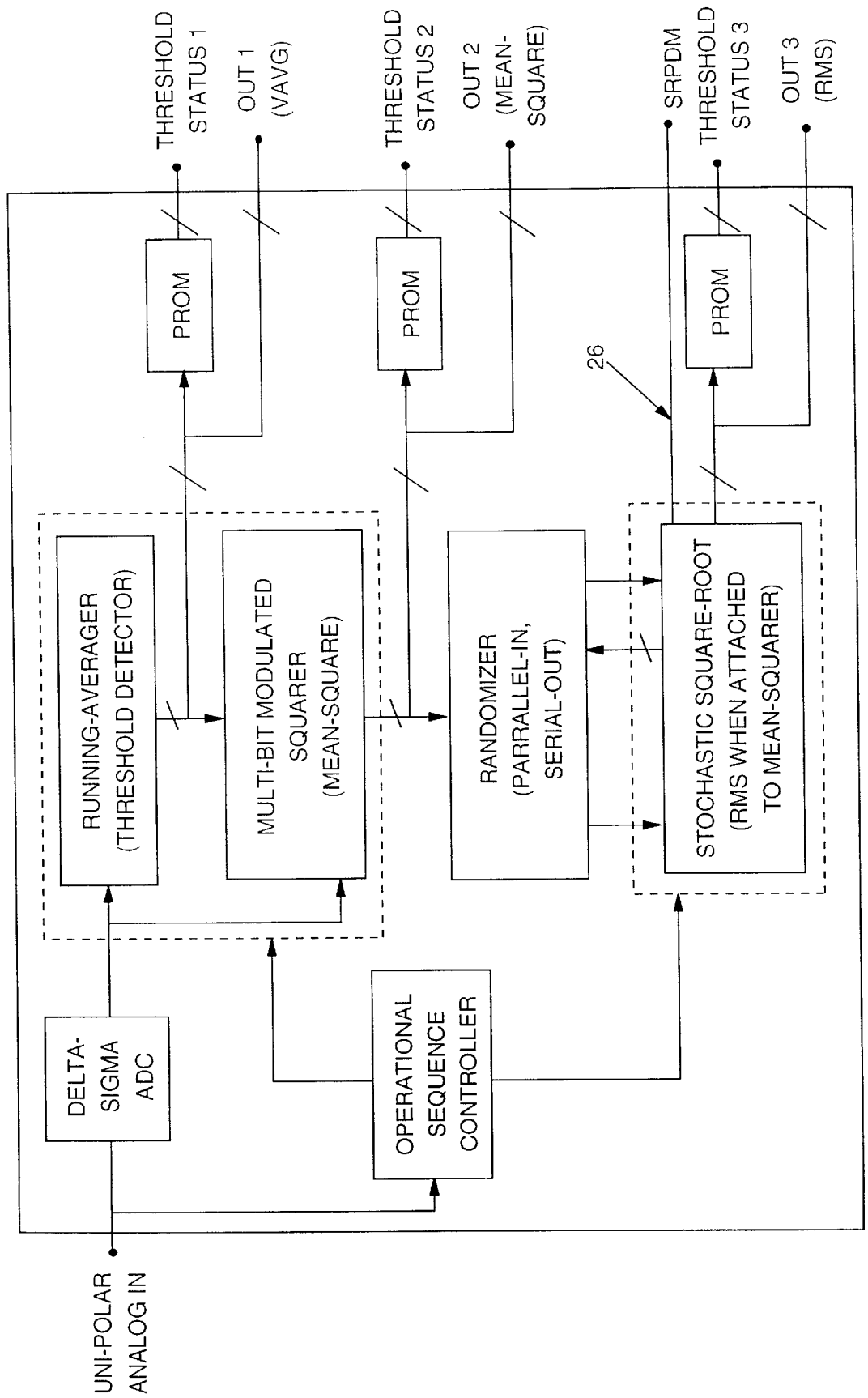
FIG. 3 depicts another configuration with a serial and parallel output from its stochastic square root circuit.
Figure 4:
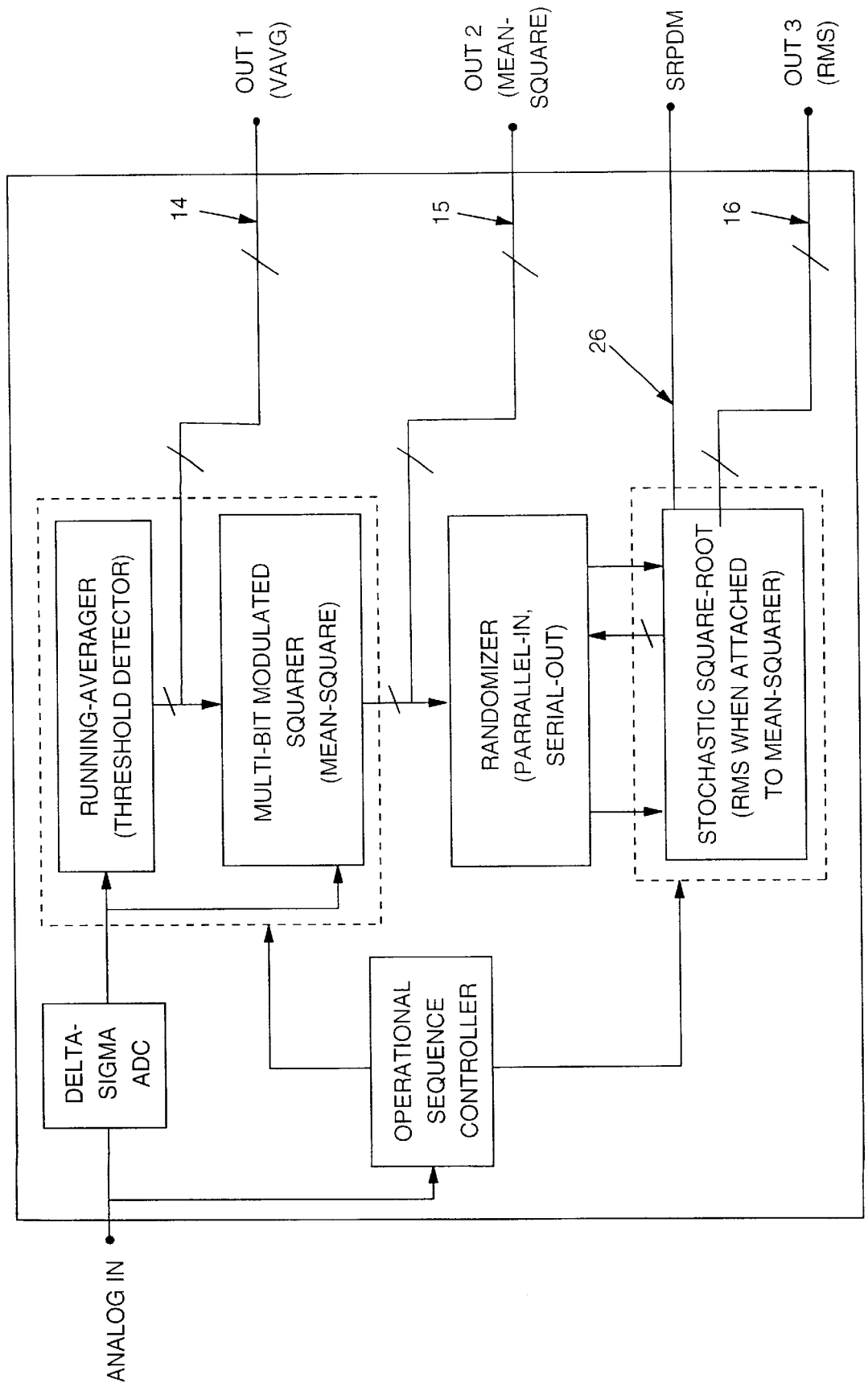
FIG. 4 depicts another configuration with a serial and parallel output as in FIG. 3 and without threshold status indicators.
Figure 5:
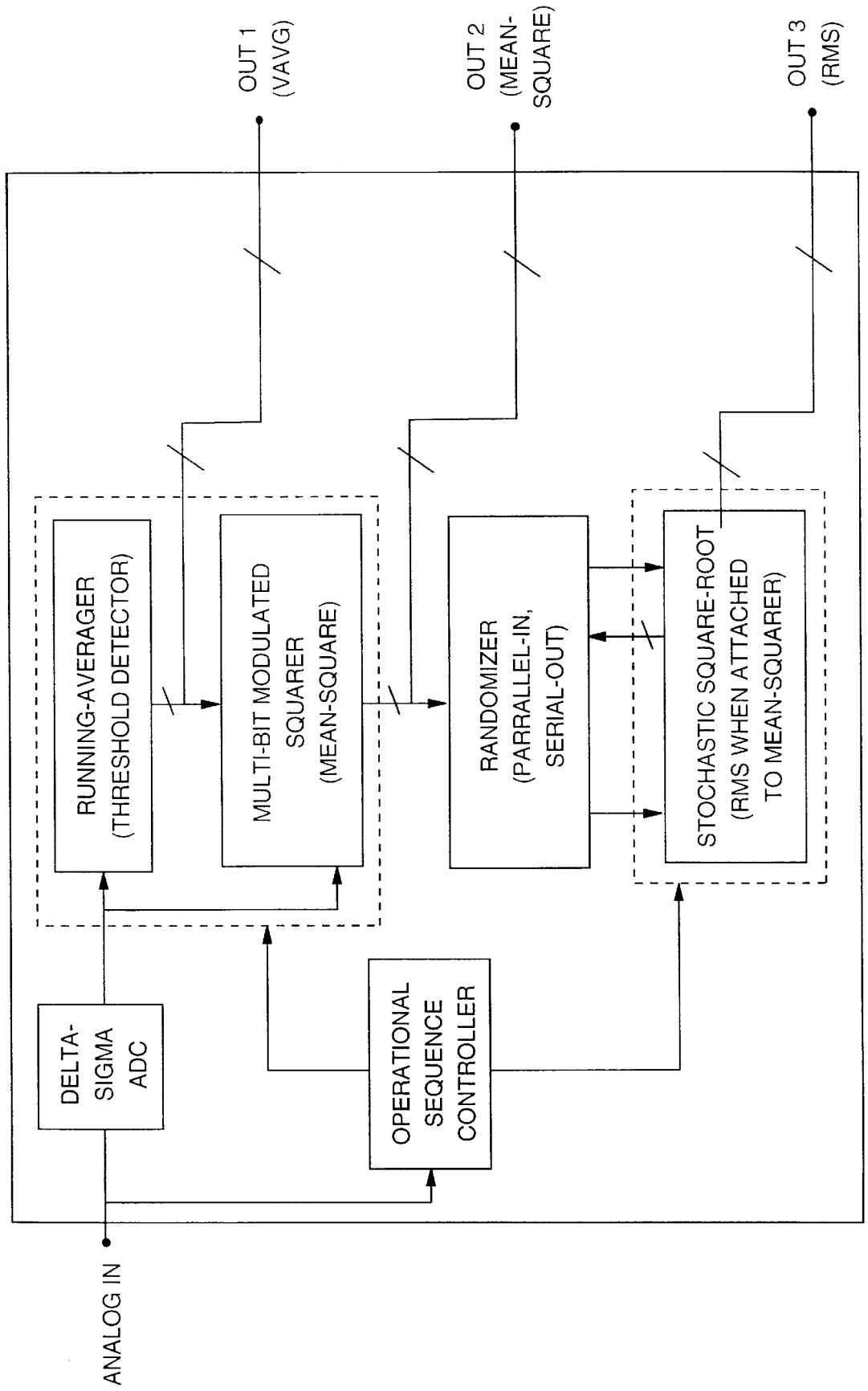
FIG. 5 depicts a configuration similar to FIG. 4 with a parallel output from said stochastic square root circuit.
Figure 6:
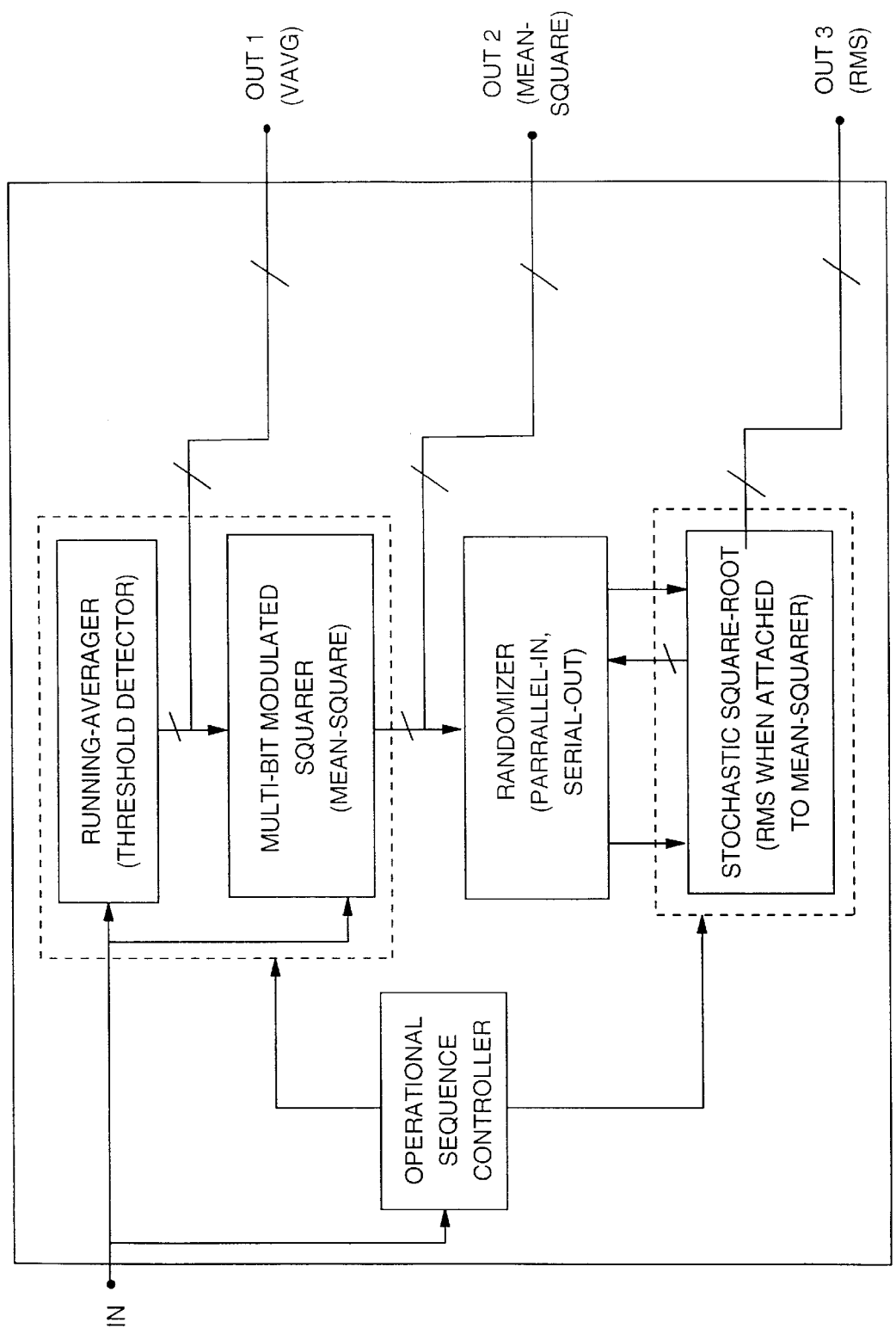
FIG. 6 resembles FIG. 5 omitting said delta sigma ADC for digital signal inputs.
Figure 7:
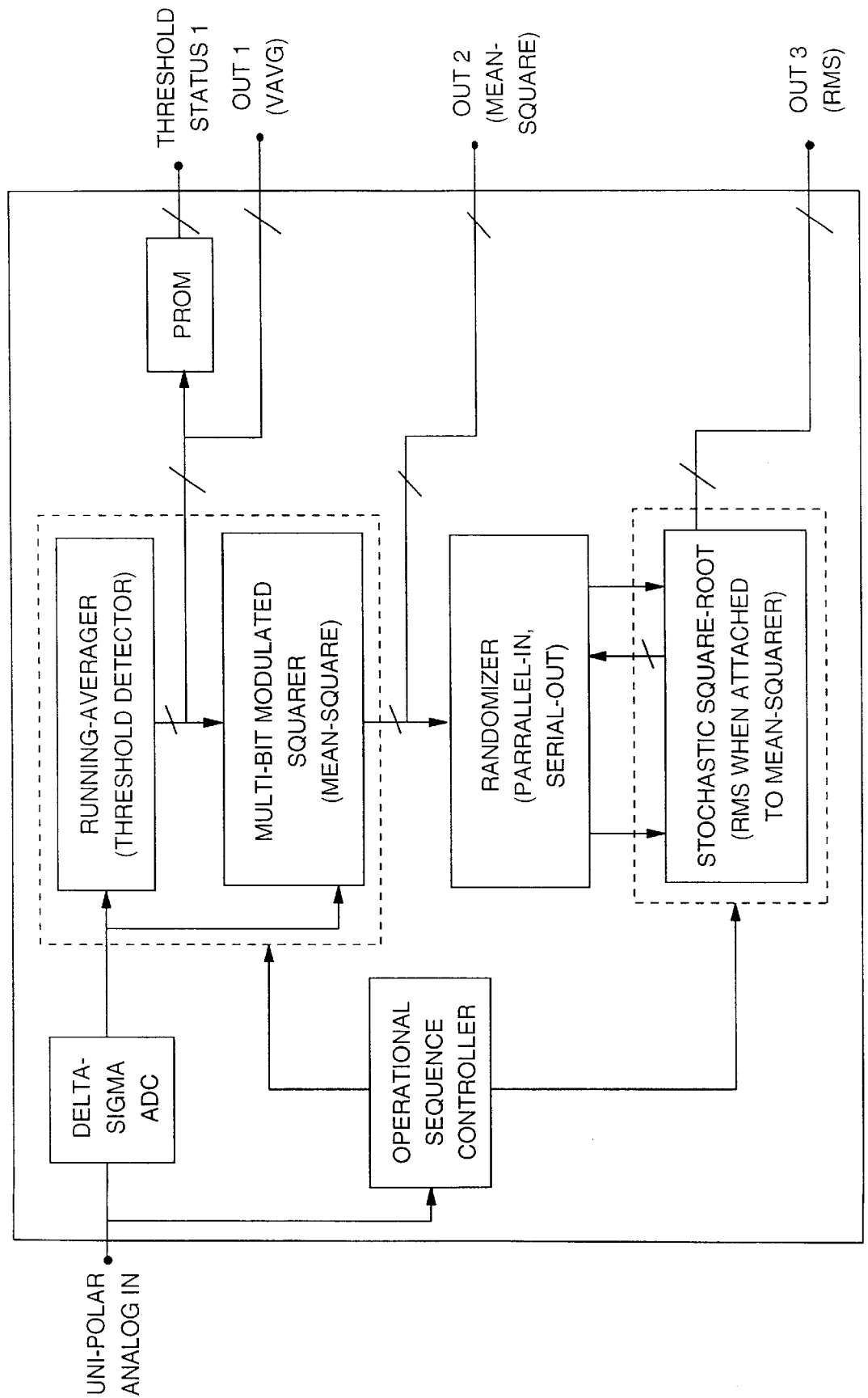
FIGS. 7, 8, and 9 resembles FIG. 5 however presenting status indications at the outputs of different processors of said circuit.
Figure 8:
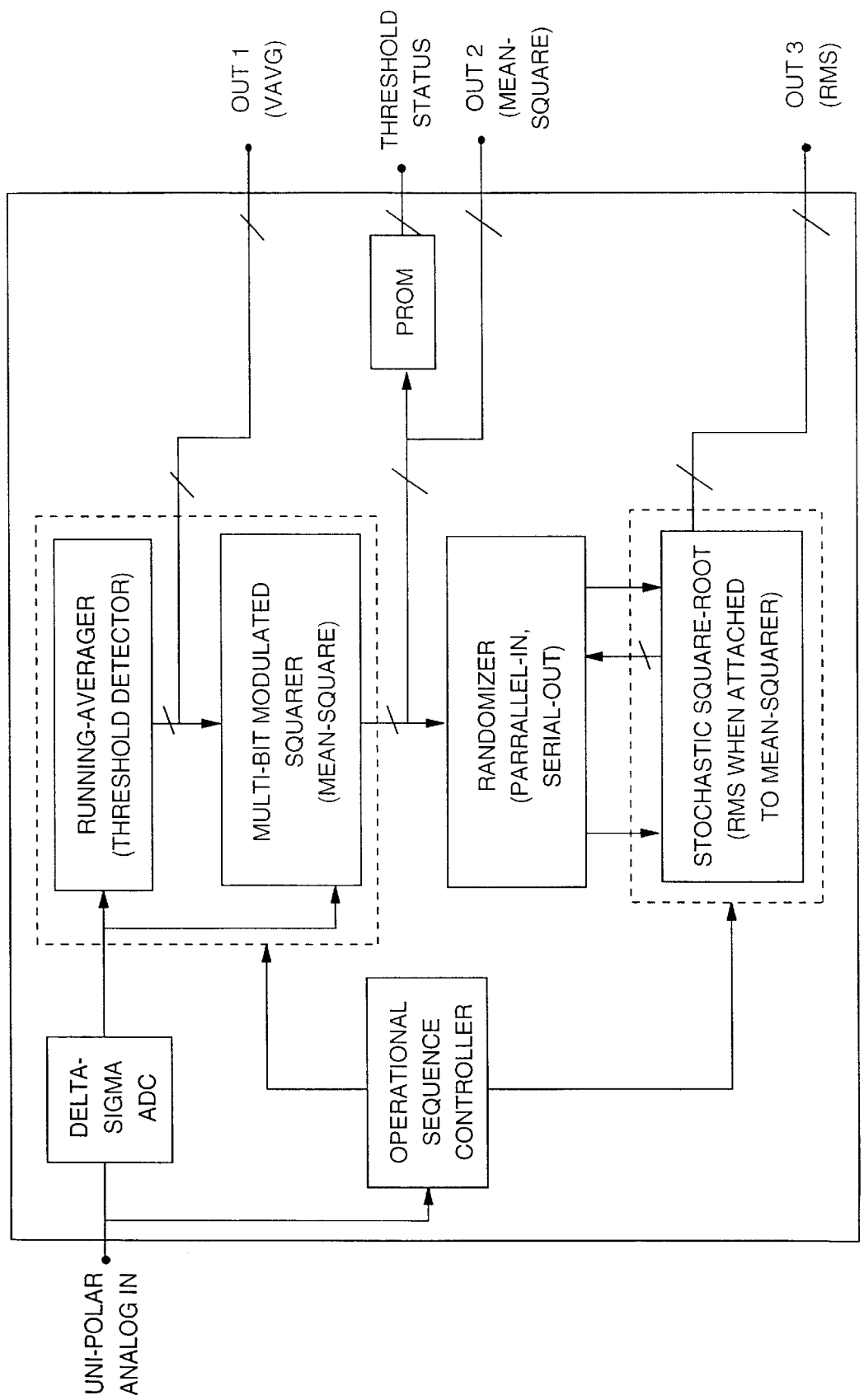
Figure 9:
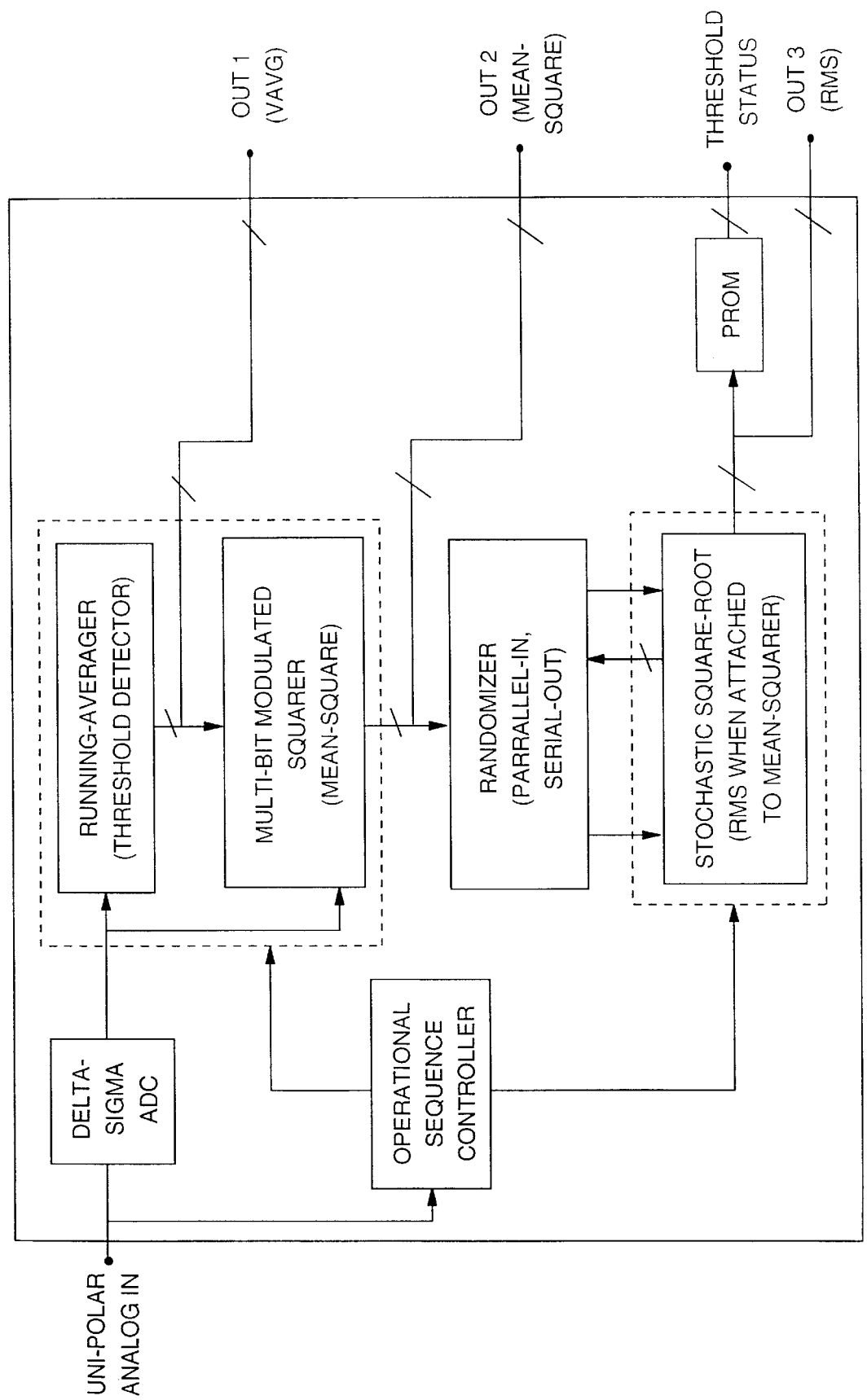

The parallel binary mean square signal output provided by the multi bit modulated squarer 5 provides input data to the stochastic square root computation circuit 7. The stochastic computation circuit advantageously may either include an internal randomizer 6 or use an external one such as described in the section on representing an analog quantity and FIG. 18 to provide a random serial bit stream in the form of a random pulse density modulated serial bit stream (see FIG. 3 signal output line 26) and a stochastic square root computation circuit 7 such as described in the section on representing an analog quantity.

The parallel binary representation of the means squared value provided by the multi bit modulated squarer 5 is transformed into a serial random pulse density modulated bit stream as described in the section on representing an analog quantity.

Figure 17:
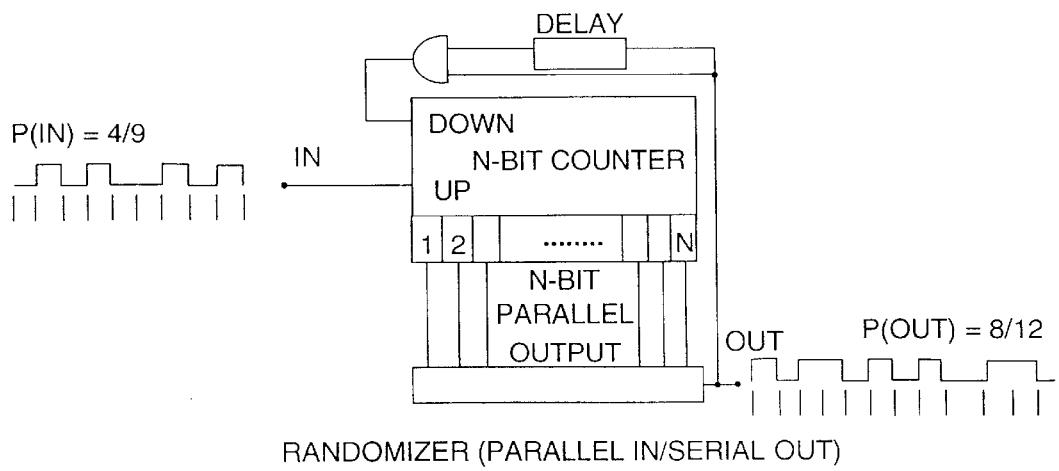
FIG. 17 depicts a stochastic steepest descent square rooting circuit.

The stochastic square root circuit 7 operates on this serial bit stream to provide a stochastic representation of the RMS voltage of the input voltage as either a parallel binary representation on line 16 of the square root of the input voltage value, and/or in addition a serial random pulse density modulated bit stream on line 26 representing the RMS of the input signal as described in the section on representing an analog quantity and FIG. 17. The parallel or serial signals can be used as aforesaid, for instance to provide external signals for controlling a power control converter or if used to address a threshold circuit as illustrated to provide a go, no go, or standby signal.

The stochastic square root circuit can produce both serial and parallel output, the serial output being produced with the aid of the randomizer.

The concatenation of the outputs of the internal components of the supervisory circuit results in a output signal from the stochastic square root circuit which represents the root mean square value of the original input signal; the successive operations of averaging, squaring the average value obtained, and extracting the square root of this resulting in the production of a signal representing the root mean square value of the input signal.

In the implementation of the invention depicted the sequence controller 25 controls the sequence in which operations are performed, so that operations are performed in the correct sequence, e. g. the mean square value is obtained before the root mean square and the mean square is evaluated over a predetermined period of the input signal. A zero crossing detector can be used to assist in the determination of the period of a periodic signal, which can be used to determine the appropriate integrating interval to use for the purposes of the supervisory circuit functions.

FIGS. 1 to 9 present different implementations of the invention herein. The delta signal converter 3 is not needed where a suitable digital input signal or voltage is presented at input 2 as will be readily appreciated by those skilled in the art.

Figure 10:
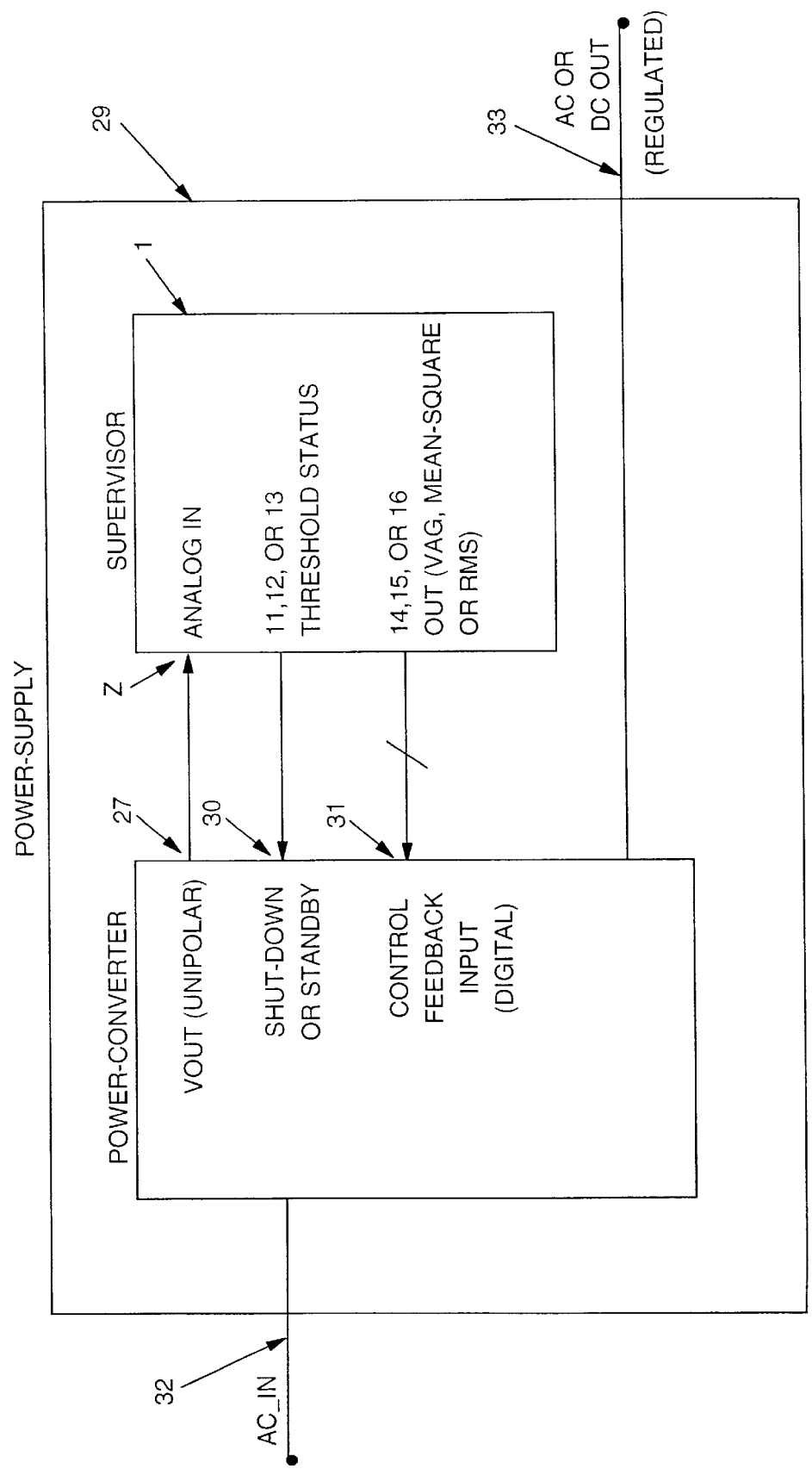
FIG. 10 depicts a power supply incorporating a supervisory circuit in accordance with this invention.

Referring to FIG. 10 which represents the supervisory circuit 1 in the environment of a power supply 29, it may be seen that the power supply comprises a power converter 27 which is adapted to condition an input voltage at input 32 to produce regulated AC or DC at output 33. The AC to DC conversion process will not be discussed in further detail as the techniques for achieving this are well known, with the exception of mentioning that the supervisory circuit of this invention is especially well suited to operate with switching power supplies or those accepting digital control.

The power converter 27 provides an output signal Vout which in this example is unipolar and is used by the supervisory circuit 1. In this embodiment the threshold status output 11, 12 or 13 of the supervisory circuit is fed to a shutdown or standby control input 30 of the power converter to protect it from unacceptable conditions, for instance by causing it to shut down; or to transfer it to a standby mode in certain circumstances, e.g. to prevent additional loading from carrying it into a operating region where damage will result. For instance in the case of DASD storage devices used in the computer industry, when power supply output becomes marginal, e. g. due to heavy loading or inadequate source voltage, the threshold outputs may be used to prevent additional write operations by the read/write heads of the DASD disk drive units.

The control feedback input port 31 is adapted to accept digital input control signals from the supervisory circuit, such as may be delivered from the Vaverage 14, Mean square 15, or RMS 16 outputs of the supervisory circuit described above. One or more of these supervisory outputs can be used to provide the information on the input power to the power converter that are necessary to enable the power converter to perform its regulation functions.

As a result of the stochastic processing techniques applied the regulation process achieved by the power supply becomes more robust and immune from noise.

Stochastic Computing
Representation of an Analog Quantity

In stochastic computing, analog quantities are represented in terms of the probability of obtaining a logical '1' in a corresponding digital bit-stream. In other words, for a unipolar analog quantity A, in the range of $0 \leq A \leq V$, the analog value may be represented by a digital bit-stream, B, such that the expected value of B, denoted E[B], is defined as:

$$E[B]=A/V=p$$

For bipolar analog signals in the range $-V \leq A \leq V$, the analog value may be represented by the digital bit-stream as:

$$E[B]=A/(2V)+\tfrac{1}{2}=p$$

Hence, for a unipolar representation, the normalized value of the analog signal, A/V, becomes the expected value of the bit-stream. For bipolar signals, however, the expected value is represented by half the normalized analog value, A/(2V) added to an offset of ½. Thus, for a 2.5 V analog input with a full-scale range of 5V, p=½ for a unipolar representation while p=¾ for the bipolar case. Ideally, the successive logic levels, $B_i$, in the digital bit-stream, are statistically independent and hence, over a long sample size, N, the resulting bit-stream assumes a binomial distribution with an estimate of p obtained as:

$$\hat{p} = \frac{1}{N} \times \sum_{i=1}^{N} B_i$$

The outcome of each sample $B_i$ in a sequence of length N assumes only one of two possible value and the outcome on any particular trial does not influence the outcome of any other trial, with the probability of an outcome being constant from trial to trial.

The above relation for p̂ shows that its accuracy cannot be measured exactly but only estimated and that the accuracy of the estimation depends on the sample size used. This dependence of the accuracy on the sample size is further accentuated by the fact that the analog signal being sampled may be time-varying. Hence, the assumption of a constant expected value is only valid when the ratio of the sampling frequency to that of the analog signal frequency is large enough to ensure that the signal level does not change appreciably over an estimation period consisting of N samples. Assuming that the sampling frequency is large enough, the error between the estimated value, p̂, and the expected value, p, may then be expressed in terms of a statistical variance. For a binomially distributed bit-stream, the variance, $\sigma^2$, for the estimate p̂ over a sample size, N, is given by:

$$\sigma_B^2 = \frac{p(1-p)}{N} \quad (2.1)$$

Hence, we have seen that normalized unipolar analog signals in the range [0, 1] and normalized bipolar analog signals in the range [−1, 1] can be mapped into the probabilistic range [0, 1]. In practice, however, the stochastic computing structures required for bipolar signals have twice the hardware complexity of unipolar computing structures along with twice the standard deviation, δ, of a unipolar computation. As a result, we will only consider systems in which the analog input is unipolar. Operations on bipolar signals will be carried out by simply rectifying the ac signal, as this is satisfactory for the computations (such as RMS) that will be executed.

Given a probabilistic representation of an analog value in terms of a digital bit-stream, one can proceed to use Boolean logic gates to operate on these bit-streams and perform mathematical operations that would otherwise be difficult to realize in the analog domain from which the signals originated. The following section will illustrate how this is achieved.

Stochastic Multiplication

From basic probability theory, one may recall that the joint probability of two random variables, X and Y with probabilities x and y are:

$$P(X,Y) = P(X|Y)P(Y) \quad (2.2)$$

In words, this states that the joint probability of observing X and Y together is equal to the probability of observing X given that Y has occurred (conditional probability), multiplied by the probability of observing Y. However, if X and Y are independent, then the joint probability simply reduces to:

$$P(X,Y) = P(X)P(Y) = x \cdot y \quad (2.3)$$

Given that X and Y are Bernoulli random variables (any random variable whose only possible values are 0 and 1), the above relation may be translated to the realm of digital logic, If one looks at the truth table for a logical AND gate as shown in Table 2.1, one can see that a logical AND gate will act as a multiplier, provided that X and

TABLE 2.1

Truth table for a logical AND gate

| X | Y | out= X · Y |
|---|---|---|
| 0 | 0 | 0 |
| 0 | 1 | 0 |
| 1 | 0 | 0 |
| 1 | 1 | 1 |

Figure 11:
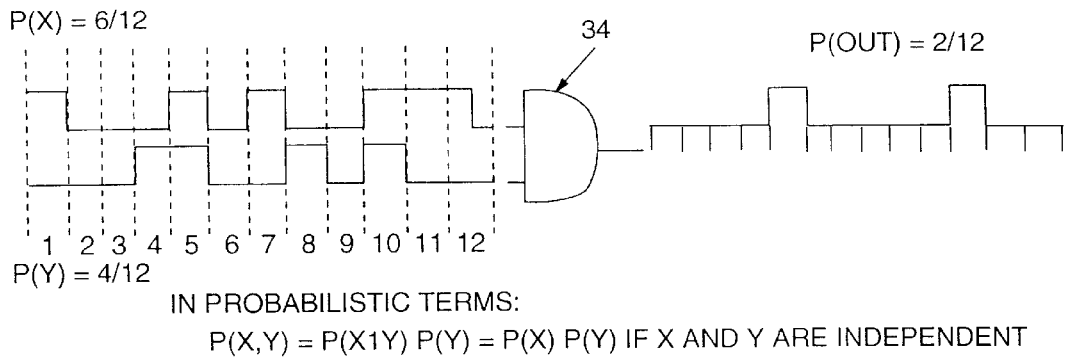
FIG. 11 depicts a circuit for stochastic multiplication.

Y are independent of each other. This is the basis for stochastic multiplication and is illustrated in FIG. 11. If X and Y are dependent or correlated in some way, then the conditional probability case of Equation 2.2 applies and the AND gate 34 no longer acts as a perfect multiplier. This effect of signal correlation is an important factor to consider when implementing any practical stochastic computing function and it will be addressed in the section on development of supervisory functions as a design issue. Since the two inputs need to be independent of each other, if one required a squaring function, one would not tie the two inputs of the AND gate to the source directly. Such a scheme would result in the output reflecting the input and this provides a good illustration of how the multiplying effect is lost when the two signals are fully correlated.

If one has a signal with a flat spectral content like that of white noise, then the auto-correlation of that signal would be a delta function. The delayed version of that signal cross-correlated with the undelayed or original signal would, hence, result in a function with zero correlation. This in effect means that a squaring scheme on a truly random signal can be executed by feeding that signal and its delayed version as the two inputs to the AND gate. Assuming that a random binomially distributed signal is available for such a squaring scheme, one can calculate the output variance, $\delta^2_{out}$, of the squaring circuit with input probability p (i.e. p equals the expected value of the input) as follows:

$$P_{out} = (p)(p) = p^2$$

From Equation 2.1,

The maximum variance, $MAX(\sigma^2_{out})$ for Equation 2.4 then occurs at giving:

The maximum variance may be reduced if ones uses a random signal on one input and $$\sigma_{out}^2 = \frac{p^2(1-p^2)}{N} \quad (2.4)$$

$$MAX(\sigma_{out}^2) = \frac{1}{4N} \quad (2.5)$$

a deterministic signal with a mean value equal to the expected value of the random signal on the other, as pointed out by Gaines [9]. In this case, given a random signal with an expected value of p and a deterministic signal with a mean of K=p, the output variance may be calculated as:

$$\sigma_{out}^2 = \frac{Kp(1-p)}{N} = \frac{p^2(1-p)}{N} \quad (2.6)$$

The maximum variance in this case occurs at p=⅔ giving:

$$\text{MAX}(\sigma_{out}^2) = \frac{1}{6.75N} \quad (2.7)$$

This can be clearly seen to have a lower variance than that obtained in Equation 2.5. The drawback to this approach is that the output bit-stream no longer has a delta function auto-correlation, making the resulting output unusable for further stochastic computations. It will be seen in the section on supervisory functions that this is not a problem for our particular application and, hence, we will use Equation 2.6 as the expression for variance in our analysis for such a scheme.

Given the output variance, one would then like to obtain the sample size, N, required for a desired accuracy. To do this, we need to make some assumptions on the output probability distribution, in order to gain some insight into the sample sizes that may be required. Hence, we will assume that the output bit-stream still retains its Binomial distribution despite the comments made in the earlier paragraph. If this assumption is made, the output probability distribution will assume a Gaussian distribution for large sample sizes, as determined by the Central Limit Theorem in statistics. The probability distribution function, f(x), for the variable x with mean, $\mu$, is then described by:

$$f(x) = \frac{1}{\sqrt{2\pi\sigma^2}} \times e^{\frac{-(x-\mu)^2}{2\sigma^2}} \quad (2.8)$$

Given that a desired (full-scale) resolution of +/−r is required from the output and that we would like the output to have this resolution with a high degree of confidence, one may proceed to calculate the sample size that is required for the specified parameters of resolution and confidence levels. The cumulative probability, $\Phi(Z_a)$, for the standard normal distribution function, is the value for the standardized case when $\delta=1$ and $\mu=0$ in Equation 2.8 so that $\Phi(Z_a)$ may be defined as:

$$\Phi(Z_a) = \int_{-\infty}^{Z_2} \frac{1}{\sqrt{2\pi}} \times e^{-\frac{x^2}{2}} dx$$

The value of this integral is well tabulated in statistical literature for various values of $Z_a$. Hence, for a desired full-scale resolution of +/−r, we would like the output value to fall within a distance of +/−r of the mean value with the specified degree of confidence given by $\Phi(Z_a)$. Since $Z_a$ refers to ($Z_a$ is chosen such that it accounts for the negative tail of the distribution as well) the number of (normalized) standard deviations, $\delta$, (standard deviation is the square-root of the variance) that fall within the confidence interval, we need to scale this normalized version to obtain the resulting deviation. This is simply done by multiplying the $\delta$ obtained for our scheme with the $Z_a$ obtained for a certain confidence level. Thus, the total length, L, of the interval in which the output value can fall is twice the resulting deviation obtained since the value obtained for $Z_a$ only accounts for half the distance (i.e. +r and not +/−r). In other words, L is:

$$L = 2Z_a \times \sigma \quad (2.9)$$

Substituting the worst case $\sigma$ from Equation 2.7 for the case when a deterministic sequence is multiplied with a random Bernoulli sequence one obtains:

Solving for the sample size N gives:

$$L = 2Z_a \times \frac{1}{\sqrt{6.75N}} \quad (2.10)$$

$$N = \frac{4Z_a^2}{6.75L^2} \quad (2.11)$$

If one used two random signals to obtain the $\delta^2$ of Equation 2.5, then the sample size, N, required is:

$$N = \frac{4Z_a^2}{4L^2} \quad (2.12)$$

One can see from Equations 2.11 and 2.12, therefore, that the sample sizes required for the mixed case of Equation 2.11 is much less than that needed according to Equation 2.12. This is best illustrated with a numerical example, where, for a full-scale resolution of +/−1 % (i.e. 40 dB resolution with a safety factor of ±0.5% taken for desired ±1% error), and a confidence level of 4.5δ (i.e. 99.9997% confidence level), the worst case sample size required for the mixed random-deterministic multiplication scheme gives (from Equation 2.11):

$$N \approx \frac{4 \times 4.5^2}{6.75 \times (2 \times 0.001)^2} = 3.0 \times 10^4$$

If two random signals are used in the multiplication scheme one gets (from Equation 2.12):

$$N \approx \frac{4 \times 4.5^2}{4 \times (2 \times 0.01)^2} = 5.1 \times 10^4$$

This shows that for the given specifications, the purely random multiplication requires a sample size that is 68% larger than that of the mixed-signal scheme.

In this section on stochastic multiplication, we have explored the issue with a fair amount of depth to give the reader an appreciation of the issues that are involved in implementing what appears to be a fairly simple operation at first glance. It must be mentioned again that the derivations obtained in this section were based on simplifying assumptions, such as the signals being binomially distributed. This allowed us to obtain an idea of the effects that various parameters have on accuracy and sample sizes and does not in any way try to describe the actual signal distribution obtained in the implementations.

Stochastic Summation

Assuming that we have two statistically independent signals once again, stochastic summation can be estimated by using a logical OR gate. If one looks at the logical truth table for an OR gate as shown in Table 2.2, one notes that in probabilistic terms, the output probability, $P_{out}$, for obtaining a '1' is:

$$P_{out} = P(\overline{X})P(Y) + P(X)P(\overline{Y}) + P(X)P(Y)$$

Denoting P(Y)=y and P(X)=x we get $$P(\overline{X})=1-x \text{ and } P(\overline{Y})=1-y$$

so that $$P_{out}=(1-y)+x(1-y)+xy=x+y-x \cdot y$$

Figure 12:
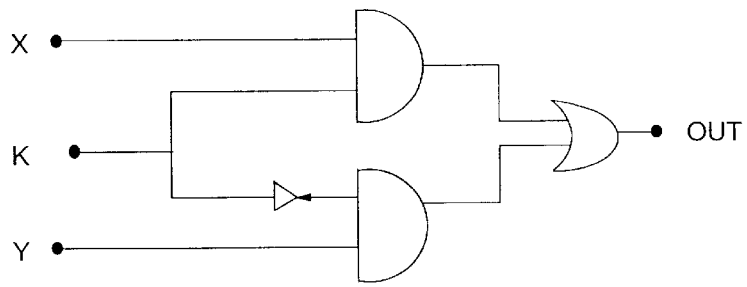
FIG. 12 depicts a circuit for stochastic summation.

The cross product term, x·y, introduces an error in this simple summation scheme. If x and Y are mutually exclusive indepedent events, however, then the cross product term is eliminated. One way to do this is to introduce a third variable, K, as shown in FIG. 12.

TABLE 2.2

Truth Table for a logical OR gate

| x | y | out |
|---|---|-----|
| 0 | 0 | 0 |
| 0 | 1 | 1 |
| 1 | 0 | 1 |
| 1 | 1 | 1 |

This variable makes X and Y mutually exclusive since $P_{out}$ is now given by:

$$P_{out}=P(K)P(X)+P(\overline{K})P(Y)$$

The variable, K, eliminates the cross product terms and also ensures that the result of the summation does not exceed one, due to the scaling factor introduced by the intermediate product terms. For P(K) being denoted by k, the output probability, $P_{out}$ may be rewritten as:

$$P_{out}=kx+\bar{k}y$$

With k=0.5, for example, the resulting sum may be seen to be exact and scaled by one-half.

Stochastic Integration

Figure 13:
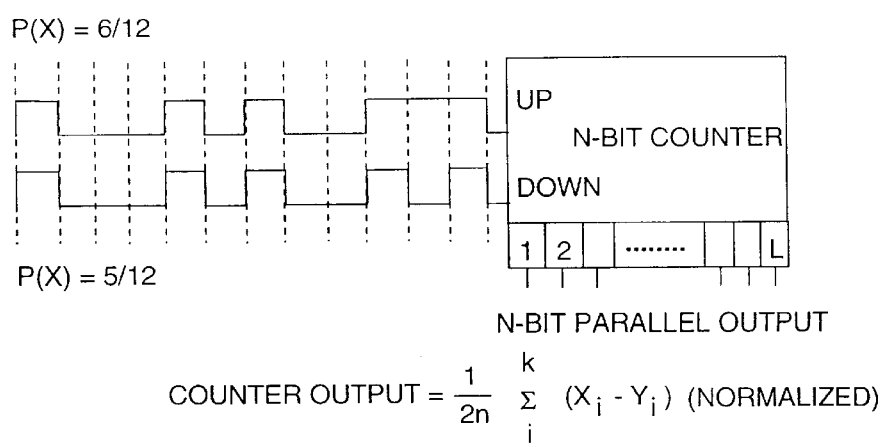
FIG. 13 depicts a circuit for stochastic integration.

Integration of a stochastic bit-stream is easily performed by using a digital counter as a discrete integrator. For example, an up/down counter can compute the resulting integral of the difference of two input signals over a count period, k, as shown in FIG. 13. The size of the counter determines the time constant as well as the variance of the resulting estimate of the integral. The variance for a binomial input is once again given by:

$$\sigma^2 = \frac{p(1-P)}{N}$$

where N is the size of the counter and for an n-bit counter $N=2^n$. The resulting sum in the integrator may be expressed as:

$$S(t) = S(0) + \frac{1}{NT}\int_0^{\tau}[\times(t) - Y(t)]dt \quad (2.13)$$

where T is the clocking period of the counter. It can be seen that a trade-off between accuracy and bandwidth occurs, since an increased counter size reduces the bandwidth (increases time constant) but increases the resolution (decreases variance).

Figure 14:
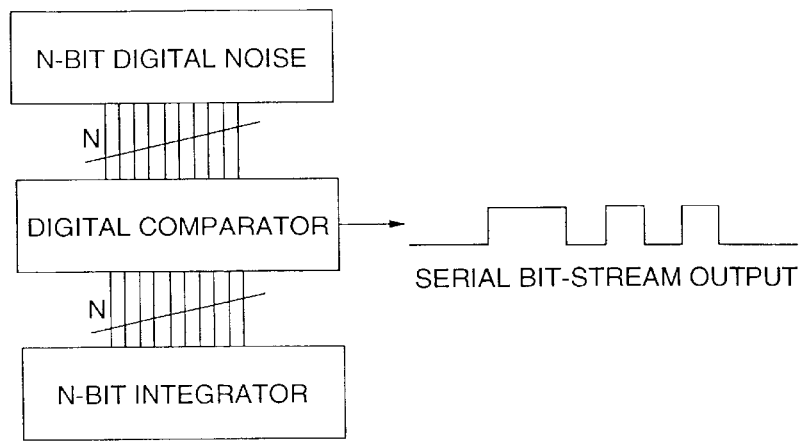
FIG. 14 depicts the generation of a stochastic bit-stream from an integrator.

At this time, one may note that the counter stores the integral in a parallel binary form. This is of no use for further stochastic computing unless a stochastic bit-stream with a mean value equal to the normalized value of the counter's contents (normalizing factor is $2^n$ for a n-bit counter) can be generated. This can be done by using a digital comparator as shown in FIG. 14 the comparator compares the count in the counter with a random variable, R, having the same size, n, as that of the counter. Each bit of the random variable, R, is required to have an equal probability of being '1' or '0' (i.e. $P(R_i)$=0.5. If such a random number can be generated, then the resulting probability of the comparator's output will have a mean value equal to the normalized value of the counter contents. This can be illustrated with a simple example using a 4 bit counter (n=4) with a count value arbitrarily chosen as 12. The normalized counter value is then $12/(2^4)$=0.75. If we now have a 4 bit random number with each bit $R_i$ having an equal probability of being '1' or '0', that is:

$$P(R_i)=0.5, \text{ for } i=1, 2, 3, 4$$

then the probability that this number exceeds the normalized count value can be calculated by first converting the decimal count value of 12 to a count value in base 2 so that $I_2$=1100. The probability that R equals or exceeds the count is then:

$$P(R=1100)+P(R=1101)+P(R=1110)+P(R=1111)=4(\frac{1}{2}^4)=0.25$$

Therefore, the probability of the count exceeding the random number is (1−0.25)=0.75. Hence, one can see that the digital comparator generates a stochastic bit-stream with a mean value that estimates the counter's contents. An alternative way of generating a stochastic bit-stream is to use the bits of the counter as a weighting coefficient to a variable probability generator. This scheme and the generation of random numbers itself will be discussed below.

Stochastic Integration with Negative Feedback

Figure 15:
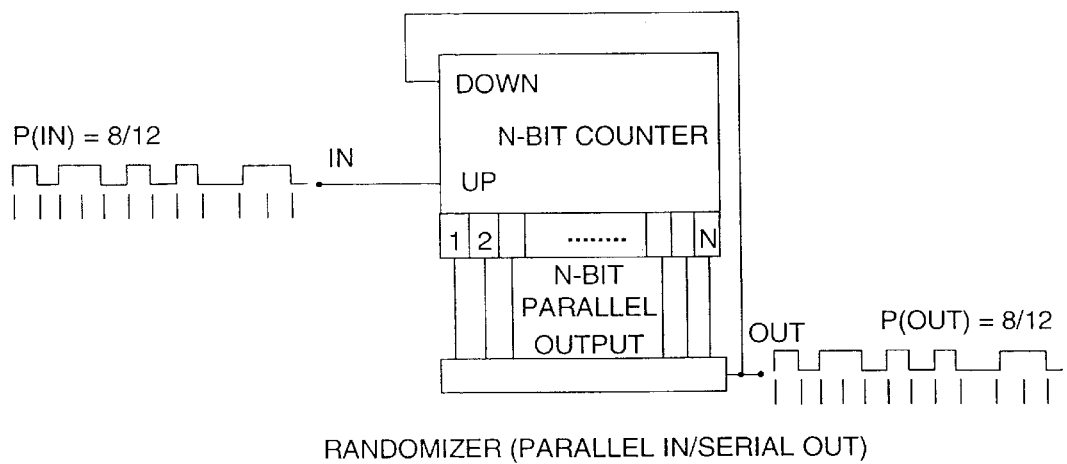
FIG. 15 depicts a stochastic integrator with negative feedback.

An important configuration can be obtained if one uses an up/down counter in a negative feedback scheme as shown in FIG. 15. This circuit acts like a leaky analog integrator and takes the running average of the input value. For a Bernoulli input with mean, p, it has been found that the counter, S, with a time constant NT, tends exponentially to an estimate of p as:

$$S(nT)=p+[S(0)-p]e^{-n/N}$$

and that it has a variance, as before, that can be expressed as:

$$\sigma_{out}^2 = \frac{p(1-p)}{N}$$

Figure 16:
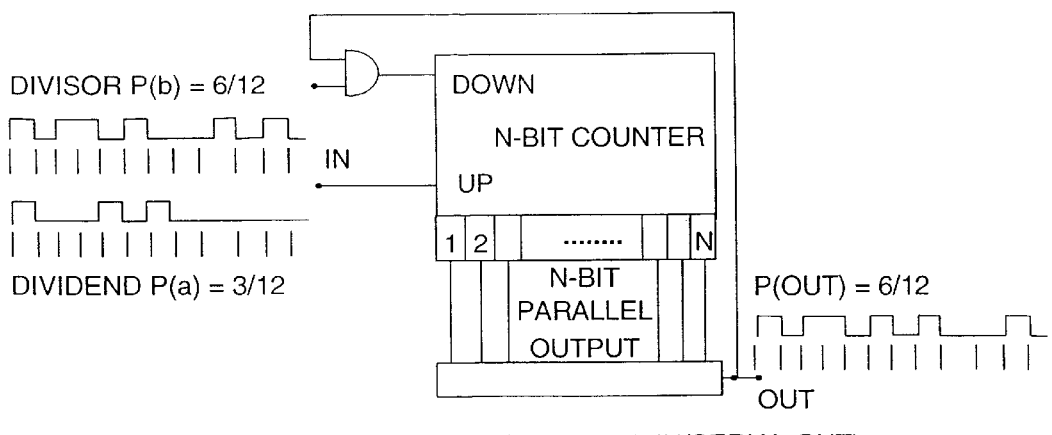
FIG. 16 depicts a stochastic steepest descent divider circuit.

This once again indicates that there is a trade-off between the accuracy and speed or bandwidth of the configuration. This configuration was one of the earliest stochastic computing elements to be invented and was originally called ADDIE (ADaptive DIgital Element). It is an extremely powerful and useful computing element to have, and can be used to build computing blocks for implicit functions such as division and square-root. FIG. 16 shows a division computing block and FIG. 17 shows a square-root computing block.

Stochastic Division

This section will describe how an ADDIE can be used to obtain a computing block that does division. It assumes that the result will stay within the range of probabilistic representation, since division by a number smaller than one leads to amplification of the dividend. Hence, one may consider the divider circuit to be an amplifying block as well, and as such it will work as long as the output does not saturate (i.e. the output probability cannot exceed one).

An ADDIE essentially acts like an operational amplifier in a negative feedback configuration and, therefore, it can be used as a dynamic error reducing element. The UP and DOWN inputs of the integrator act like the plus and minus terminals of an operational amplifier and so the integrator tries to keep its contents at a value that will make the DOWN input track the UP input (given that the source is fed to the UP terminal). Such a configuration is termed to have a "steepest-descent" operation and the resulting scheme required to obtain division can be devised as follows. Given $P_{out}$=output probability, $P_a$=dividend probability and $P_b$=divisor probability, we require $P_{out}=P_a/P_b$. Hence, $P_bP_{out}$ should equal $P_a$ and any deviation is defined as the error, $\delta$, where:

$$\delta = (P_b P_{out}) - P_a$$

Since $\delta^2$ is a positive value and represents the magnitude of the error, any procedure that reduces $\delta^2$ or makes its derivative negative will eventually force $\delta$ to zero. Therefore:

$$\delta^2 = P_b^2 P_{out}^2 - 2P_a P_b P_{out} + P_a^2$$

For $P_a$ and $P_b$=constant $$\frac{d}{dt}\delta^2 = 2P_b(P_bP_{out} - P_a) \times \frac{dP_{out}}{dt} = 2\delta P_b \times \frac{dP_{out}}{dt} \quad (2.14)$$

For this to be negative implies that $\delta$ and are of opposite signs, so that one may write Equation 2.14 as:

$$\frac{dP_{out}}{dt} = -K(P_b P_{out} - P_a)$$

This relation basically states that the ADDIE integrator $dt^{dP_{out}}$ changes such that the dividend needs to feed the UP input and the product of the division and integrator's stochastic output needs to feed the DOWN input of the counter. The resulting ADDIE configuration for this divider circuit is shown in FIG. 16.

Stochastic Square-Root

The ADDIE can be configured in a fashion similar to the divider circuit to obtain a square-rooting operation. This time the steepest-descent configuration can be devised as follows. Given $P_{in}$=input probability and we want $$P_{out} = \sqrt{P_{in}}$$

the error, $\delta$, is:

$$\delta = P_{out}^2 - P_{in}$$

giving, $$\delta^2 = P_{out}^4 - 2P_{in}P_{out}^2 + P_{in}^2$$

Therefore, $$\frac{d}{dt}\delta^2 = 4P_{out}\delta \times \frac{dP_{out}}{dt} \quad (2.15)$$

Since we need the above derivative to be negative, this means:

$$\frac{dP_{out}}{dt} = -K(P_{out}^2 - P_{in})$$

This relation indicates that the counter changes such that the input is fed to the UP side and the square of the integrator's stochastic output is fed to the DOWN side of the counter. This scheme is shown in FIG. 17. One may note that this type of configuration is similar to the configurations used in a conventional analog computing circuit where, the squaring multiplier is placed in the negative feedback loop of an operational amplifier to provide a square-rooting function.

Random Number and Variable Probability Generation

Random Number Generation

In the past three sections, we have alluded to the existence and use of random binary numbers where each bit has an equal probability of being '1' or '0'. The most common and efficient way of attaining such a number is through the use of linear feed-back shift registers. Linear feed-back shift registers (LFSR) work by cascading n shift registers, with feedback to the first stage coming from a combination of the outputs of the various stages, gated together by logical EXCLUSIVE-OR gates. The resulting sequence of binary numbers taken in parallel from the n-stages or in serial format from any or all of the stages, produces a sequence of random numbers. This sequence repeats after $2^n-1$ cycles when the feed-back is obtained from the proper registers, to attain what is known as a maximal-length cycle. The proper feed-back register outputs or paths are obtained by determining the primitive factors (i.e. irreducible factors) that will produce a characteristic polynomial of order n. The LFSR is said to produce a "pseudo-random" binary sequence, since a true random sequence would never repeat. The resulting pseudo noise (PN) sequence out of a n-stage LFSR has the following important noteworthy properties:

Maximal-Length cycle=$2^n-1$
Probability of 1's, $P(1)=2^{(n-1)}/(2^n-1)$
Probability of 0's, $P(0)=(2^{(n-1)}-1/(2^n-1)$
Autocorrelation function, $A(m)$, is repetitive with period $2^n-1$
$A(0)=2^{(n-1)}$
$A(m)=2^{(n-2)}$, for m not equal to zero.

From these properties it can be seen that, $P(1)$ and $P(0)$ approach the ideal desired probability of 0.5 as n gets larger. A large n also elongates the period before which the cycle repeats. Experimental results indicate that to a first approximation, the resulting sequence assumes a binomial distribution. The autocorrelation function is not the ideal delta function of a true white noise source, however, and this remains a practical problem. The generation of PN sequences by other digital methods, such as Cellular Automata (CA), indicate that better autocorrelation functions may be attained. CA operate by changing the state in a present cell or register, based on certain rules governing the past values of its neighboring sites. An n=cell CA has maximal-length cycle of only $2^{0.61(n+1)}$. Hybrid CA (where the rule governing the neighboring site's state depends on a particular cell's location) which are more complex, give maximal length cycles of $2^n-1$ like LFSRs, but have distorted distribution characteristics that make them unattractive for practical use.

It was hence decided that LFSRs be used for random number generation, as they offer the most efficient structures to date and have well known characteristics.

Variable Probability Generator

Figure 18:
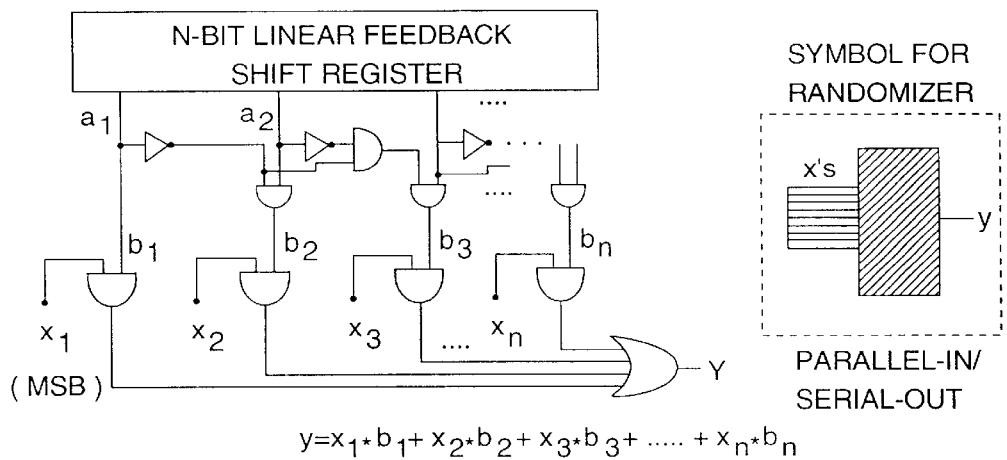
FIG. 18 depicts a variable probability generator or randomizer.

The use of variable probability generator was mentioned earlier. The generator produces a stochastic bit-stream, with the generating probability being controlled by the binary weighting coefficients that are fed to it. Its operation is an ingenious idea whose configuration is shown in FIG. 18. It works on the assumption that one has a set of independent binary random variables, $a_i$, with each having a $P(a_i=1)=0.5$. Such a set of binary numbers can be obtained from a LFSR as discussed in the previous section. If one now generates a logical function, $b_i$, such that $b_1=a_1$, $b_2=\bar{a}_1 a_2$, $b_3=\bar{a}_1 \bar{a}_2 a_3$, $b_n = \bar{a}_1 \bar{a}_2 \ldots \bar{a}_{n-1} a_n$, one notes that each of the variables, $b_i$, is mutually exclusive, In other words, no more than one of the $b_i$ will be ON at any given clock cycle so that $b_i b_j=0$ for i not equal to j. Since the binary numbers $a_i$ are independent, the variables $b_i$ are binary weighted so that $P(b_1)=\frac{1}{2}^2$ or in general $P(b_n)=\frac{1}{2}^n$. Furthermore, since the $b_i$ are mutually exclusive, they can be exactly summed by an OR gate. FIG. 18 illustrates the scheme, where the coefficients $x_1, x_2, x_3$ etc. denotes the binary representation of a counter content X. Using the $x_i$ as weighting coefficients, one can see that the resulting probability at the output of the generator is an approximation to the normalized counter contents, with the resolution getting better as the size of the generator increases. Hence, a n-bit variable probability generator is capable of generating a probabilistic output with a resolution of $2^{-n}$.

Thus, the variable probability generator can be used to generate a stochastic serial bit-stream representative of the parallel count in an integrator, or it can be used to generate probabilistic constants for use in a certain computation. In either case, the probability of the bit-stream is set by the weighting coefficients $x_i$.

Conversion of the Analog Input

As mentioned earlier, the objectives require that one be able to carry out signal processing functions on analog quantities. As such, we require a front end to the stochastic or pulse density based computing system that will generate a pulse density modulated (PDM) bit-stream representative of the analog input value. Stochastic analog-to-digital conversion techniques were reviewed, but it was found that the resulting hardware complexity exceeded that of a simple first-order Delta-Sigma Modulation (DSM) based analog-to-digital converter (ADC). Furthermore, as was noted earlier, certain computations benefit from the use of deterministic signals which can be provided by such a DSM. It will also be seen that an alternative scheme for multiplication can be devised by using the PDM bit-stream from a DSM based ADC.

DSM based ADCs are in use in a variety of commercial products and an abundance of literature on the subject exists. Applications for DSM based circuits continue to increase and, hence, one may consider it a mature and well established technique for data conversion.

Delta-Sigma Modulation Based Analog-to-Digital Conversion

DSM based ADCs are a class of highly over-sampled data converters, where, the output data rate is many times the Nyquist frequency. As a result of oversampling, the design of anti-aliasing filters (AAF), required at the front end of all sampled-data systems, is made very simple. This is because the selectivity of the filter (i.e. the ratio of stop-band to pass-band frequency) is made less stringent due to the shift of the aliased spectrum by the oversampled frequency. The shifted spectrum pushes the stop-band to much higher frequencies making it possible to use a very simple and inexpensive RC filter as the AAF.

Figure 19:
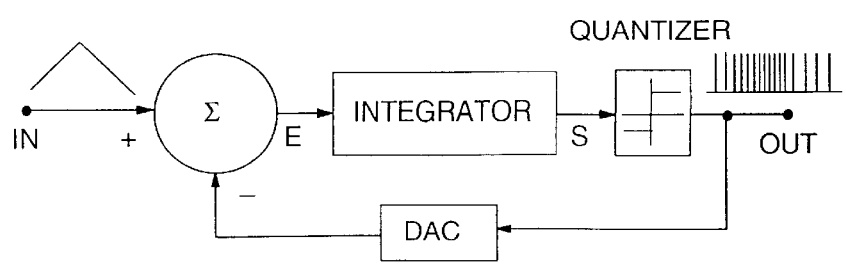
FIG. 19 depicts a first order delta sigma modulating analog to digital converter.

The simplest DSM based ADC is a first-order, two level quantizer configuration and this is shown in FIG. 19. Such a scheme produces a single binary bit-stream that is a PDM representation of the analog input. It consists of an analog integrator that operates on the differences between the analog input value and the fed back digital-to-analog converter (DAC) voltage level. Being a two level implementation means that the quantizer is simply a comparator and, hence, a DAC is not required in the feedback. This is in contrast to a multi-level DSM, where a DAC would be required in the feedback. A first-order implementation means that only one integrator is used in contrast to a cascade of integrators that would be required for higher order implementations. Higher order DSMs are more complex and require a number of other issues such as stability to be addressed in a practical implementation. In general, higher order structures or multi-level quantizers are used to increase the signal-to-noise ration (SNR) of the converter with the trade-off being increased hardware complexity.

The integrator in the DSM makes the analog input signal see a low-pass filter transfer function while acting as a high-pass filter for the quantization noise that is injected at the quantizer stage. As a result, the DSM is said to provide noise shaping by effectively taking the quantization noise spectrum and decreasing its power in the signal passband while increasing it in the stopband. The oversampling ratio (OSR), defined as the ration of the sampling frequency to the Nyquist frequency (defined as twice the maximum signal frequency), can be used to theoretically increase the SNR to any level. This is shown by the following relation for a first-order DSM with a n-bit quantizer, where n=1 for a two level quantizer:

$$SNR \approx 6.02n + 9.03 \log_2(OSR) dB \quad (2.16)$$

For a second-order DSM, the SNR is further improved by:

$$SNR \approx 6.02n + 15.05 \log_2(OSR) dB \quad (2.17)$$

Hence, one may note from Equation 2.16 and 2.17 that the SNR of an oversampling DSM based ADC increases at a much faster rate for a doubling in the OSR than it does for a corresponding doubling in the number of quantization levels used. This is essentially because of the noise shaping characteristics described. The high-pass noise transfer function also means that the two level quantizer or comparator used in the DSM can have dc offsets without affecting the accuracy of the conversion. This is because the dc offsets in the comparator may be viewed as a dc noise being injected at the quantizer stage which then faces a high-pass transfer function. This obviously has practical advantages in that complex offset-free comparator structures are not necessary.

Although higher order DSMs offer better SNRs due to the noise shaping, such DSMs are not attractive for use in our applications. This is partly because stochastic computing systems do not utilize the noise shaping characteristics of the DSM, since by definition, these systems operate on random noisy signals. In addition, the limit cycle oscillation rate for a first-order DSM is higher than that of higher order, or for that matter, bipolar DSM structures. Such limit cycle oscillations (the rate at which the pulse pattern in the bit-stream repeats) which are normally undesirable in acoustic applications can be of advantage in stochastic systems since the faster rate allows for a quicker estimation of the mean value of the bit-stream to be made. First-order DSMs also have a larger dynamic range for input signals and hence require less scaling to be done on the input signal. Finally, higher order DSMs were actually found to degrade the performance of the PDM squaring scheme developed later. Hence, the simplicity of the first-order DSM structure along with a consideration of the above factors make it the most advantageous ADC scheme to use.

Computations Using Pulse Density Modulated Signals

Estimation of the Analog Input Value

Customarily, the DSM output goes through a "decimation" routine, after which the resulting multi-bit word is processed by a digital signal processor (DSP). The decimation routine entails taking the single bit-stream (for a 1-bit or two-level quantizer) of information from DSM and accumulating it so that a multi-bit word is generated. This multi-bit word is then sampled at a much lower rate than the oversampling frequency, so that a DSP may carry out conventional digital computations. The decimation routine also suppresses the quantization error and undesired high frequency analog input noise, by acting as a low-pass digital filter. The net result of the decimation process is to provide a mean value of the analog signal at the decimated rate.

The simplest decimator is an accumulate-and-dump circuit For a two level quantizer, the accumulator is a "simple" binary counter which sums up the DSM output over the decimation period and then resets itself for the next evaluation. For a decimation ratio, D, defined as the ratio of the input frequency to the output frequency, one may express the transfer function of this digital filter (in the z-domain) as:

$$H(z) = \frac{1}{D}\sum_{i=0}^{D-1} z^{-i} = \frac{1}{D} \times \frac{1-z^{-D}}{1-z^{-1}} \qquad (2.18)$$

In this case, the input frequency is the oversampling frequency, $f_s$, and the output frequency is the oversampling frequency divided by the number of cycles of accumulation, D. The resulting frequency response of this filter may be obtained by substituting $z=e^{j2\pi f/f_s}$ in Equation 2.18 to obtain:

$$H(e^{j2\pi f/f_s}) = \frac{\text{sinc}(\pi Df/f_s)}{\text{sinc}(\pi f/f_s)} \qquad (2.19)$$

The decimation process allows for the extraction of the mean value of an analog signal at the rate of $f_s/D$. This multi-bit mean value may be used for further processing in both the stochastic and conventional computational realms. One may proceed with stochastic computations from the decimated word, by using the variable probability generator as discussed earlier to regenerate a random pulse density modulated (RPDM) bit-stream that is representative to the mean value of the binary decimation counter. On the other hand, one may use the counter's value to proceed with DSP based computations, or use the count for DSM based multiplying schemes which will be discussed next.

Although a decimator circuit will not be used, a modified version that produces a running average of the analog signal will be used. Its characteristics are very similar to the simple decimator explained here, and its application will be discussed in more detail in the next section.

Delta-Sigma Modulation based Multiplication Schemes

Digital filters are in widespread use for various signal processing functions. In situations where the input signal is in analog form, the filter requires the use of an ADC to obtain a pulse code modulated (PCM) digital word upon which it can operate. This PCM word it operated upon by standard digital or DSP circuitry using multi-bit multipliers and adders. This can result in expensive hardware and as a result next DSM based multiplication schemes have recently become of interest.

Figure 20:
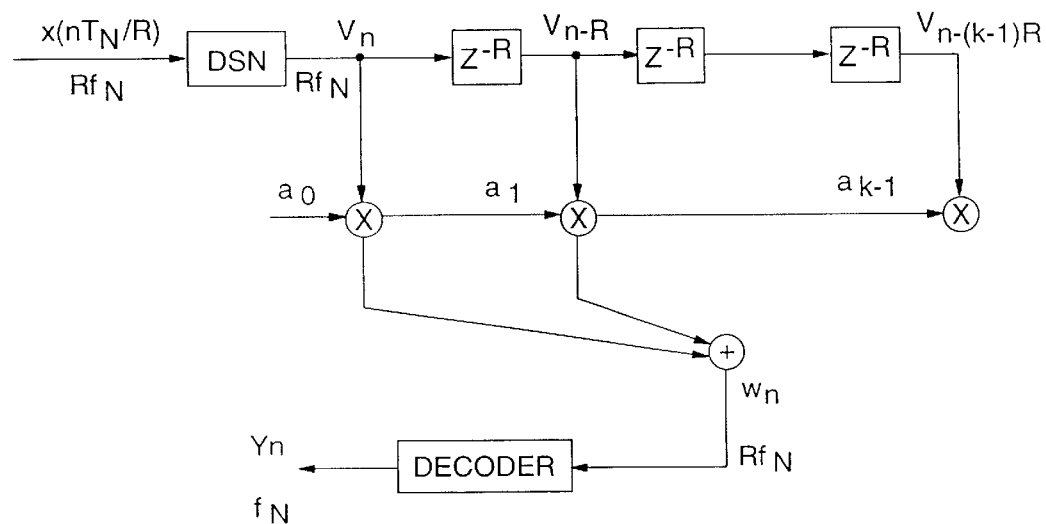
FIG. 20 depicts a FIR filter implemented using DSM input and PCM filter coefficients.

The DSM based multiplication scheme can be illustrated by showing a typical way in which an FIR filter structure. FIG. 20 shows the filter structure, where, the analog input signal is Delta-Sigma modulated with an OSR or R (Nyquist frequency=$f_N$) and the filter coefficients are in PCM form. Each tap of the filter produces a 1-bit value and hence the multiplication can be implemented with a simple switch or logical AND gate. In their particular application, the entire sum (or convolution) could be computed by having the tap lines act as address lines to a read-only-memory (ROM) device, where the resulting sums for a particular filter with certain coefficients reside as the data at that address location. This eliminates the need for expensive multiplication and makes the filter programmable by changing the contents of the ROM.

The above information provides background information for a new multiplication architecture used for mean square determination.

DEVELOPMENT OF SUPERVISORY FUNCTIONS

Threshold Detection Function

Threshold detection is one of the commonly used functions in a supervisory circuit. It entails the monitoring of a do value and ensuring that the value stays within the specified range of operation. The upper and lower levels of the range may drift due to aging, or may be required to change due to product upgrades. Such changes are difficult to accommodate in conventional threshold detection circuits. The invention provides a threshold detection scheme that is capable of having its reference levels altered to accommodate changes.

Threshold detection, in essence, is the measurement of the "instantaneous average" value of a signal. The decimator circuit described previously essentially does this and in addition also serves to act as a low-pass filter. This filtering characteristic is especially helpful in avoiding false triggers caused by the presence of high frequency switching noise in switch-mode power supplies. However, the decimator circuit described previously reduces the rate at which the data is re-examined so that conventional multi-bit digital computation techniques can be used. This is done by accumulating the bit-stream data over a certain period, D, and then dumps it to the follow-on processing circuit so that the count obtained is only valid at the end of the accumulation period. For our purposes, however, it is desirable to have a continuous reading of the measured value. This makes the monitoring circuit easier to implement and also allows for the use of the threshold circuit in other functions such as the squaring function that will be described in the next section.

Figure 21:
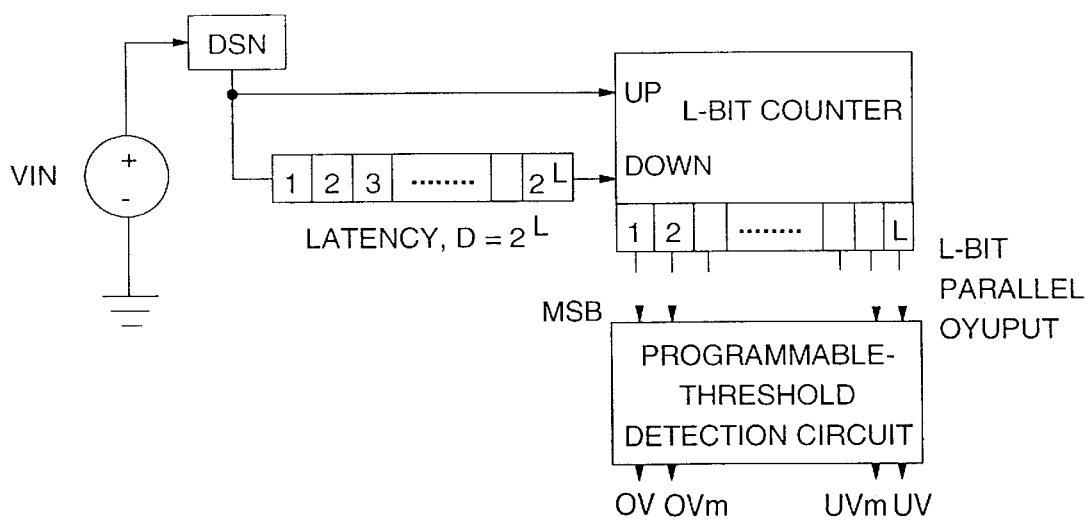
FIG. 21 depicts a programmable threshold detection circuit.

A method that provides such a continuous reading or "running average" of the monitored signal is obtained by the circuit shown in FIG. 21. The circuit of FIG. 21 works by having the DSM output feed both the Up input of an Up/Down binary counter and the first cell of a shift register. By using a shift register of size $2^L$ with a L-bit Up/Down counter, the counter is ensured of not overflowing on continuous operation. Furthermore, the average value of the input signal can be read at any time and hence, the circuit does not reduce the rate at which the data can be read. The parallel binary output of the counter (which provides the normalized average value of the input signal) can then be fed to a digital threshold decision circuit. This decision circuit can be built from either combinational logic or a simple read-only memory (ROM) device. In either case, the parametric tests for under-voltage, over-voltage or marginal voltage on a dc signal, for example, can be executed simultaneously with the single threshold detection circuit. Most importantly, the threshold levels can be easily changed by reconfiguring the decision logic or reprogramming the ROM. This is in contrast to a typical analog implementation where, each test requires a comparator with a corresponding analog reference voltage whose value is difficult to change.

Figure 22:
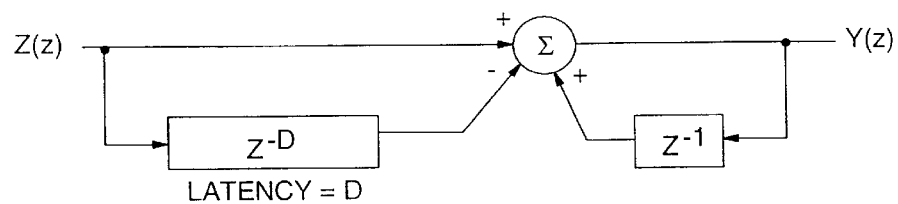
FIG. 22 depicts a signal flow-graph for a threshold detection circuit of the invention.
Figure 23:
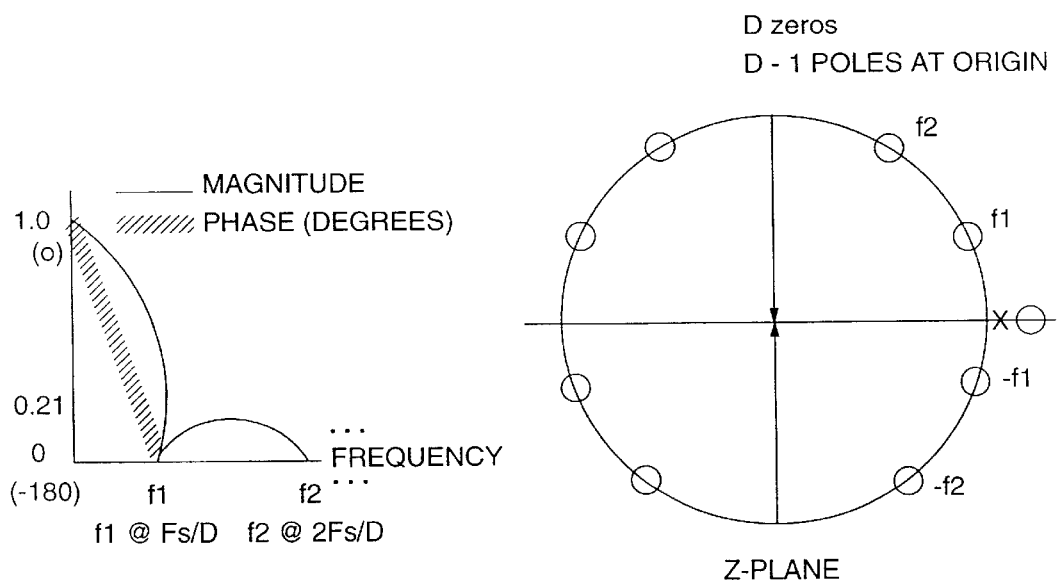
FIG. 23 depicts the frequency response and pole-zero plot for the running averager of the invention.

The filtering characteristics of the running-averager in the threshold detection circuit can be obtained by studying the signal flow graph of FIG. 22. The z-domain transfer function may then be obtained as:

where L=number of bits in the Up/Down counter and $D=2^L$ is the number of shift register cells or latency. By substituting $z=e^{j2\pi f/f_s}$ in Equation 3.1, one obtains the same $$H(z) = \frac{1}{D} \times \frac{1-z^{-D}}{1-z^{-1}} \quad 3.1$$

frequency response as the simple decimator scheme, namely $$H(e^{j2\pi f/f_s}) = \frac{\text{sinc}(\pi Df/f_s)}{\text{sinc}(\pi f/f_s)} \quad (3.2)$$

where once again, $D=2^L$ is the number of shift register cells and hence the maximum count in the counter and $f_s$=sampling or clocking frequency of the detector circuit. The frequency response and pole-zero plots for this scheme as shown in FIG. 23. It can be seen from the transfer function that the resulting low-pass filter has zeroes at integer multiples of $f_s/D$. One can, therefore, control the placement of the zeroes by either varying the sampling frequency, $f_s$, or the length, D, of the shift register. The length, D, also controls the resolution of the threshold detection circuit and hence, once again there is a trade-off between the resolution and bandwidth that can be obtained. The signal bandwidth needs to be restricted so that it is not affected by the filter's frequency response. For example, if the maximum passband attenuation of the signal is to be no more than 1%, then the signal bandwidth should not exceed more than $\frac{1}{13}$ of fs/D. Therefore, signals with significant harmonic content above $f_s/13D$ will be subject to more than the allowed harmonic distortion. This requirement results in a relatively large ratio between the sampling and signal frequencies. As a result, the resolution that the DSM bit-stream is capable of providing, far exceeds the resolution that can be provided by the threshold detection circuit (Equation 2.16). Hence, one may conclude that the running-averager of the threshold detection circuit controls the final resolution of the measured signal. For a dc input signal, the resulting resolution provided by the threshold detection circuit is +/−(L+1) bits for a shift register length of $D=2^L$. Resolution is measured in terms of a +/− deviation (full-scale) from the actual value. Hence, L+1 bits resolution is achieved in either direction.

Squaring Function

Figure 24:
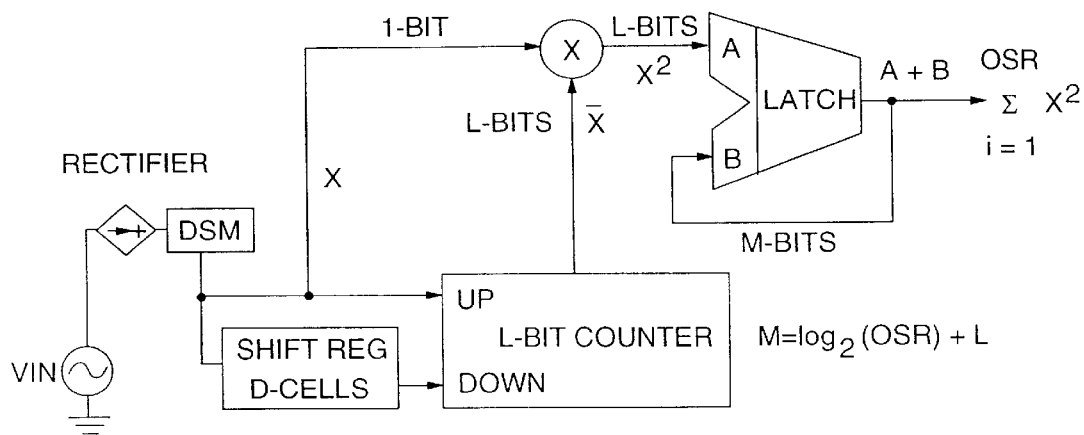
FIG. 24 depicts the multi-bit modulated squaring scheme of the invention.

In FIG. 20, the multi-bit filter coefficients were modulated by the DSM bit-stream, to obtain a resulting multi-bit word whose sum amounted to the multiplication of the signal by the filtering coefficients. That scheme may be modified so that in place of the filtering coefficients, one now places a multi-bit word representative of the input signal. The DSM bit-stream can then modulate a multi-bit representation of the same source signal providing a result that is the square of the input signal. This multi-bit word may once again be generated by using the running-averager circuit, so that the new squaring function may be devised as shown in FIG. 24. The DSM bit-stream essentially controls whether the multi-bit word is presented to the adder, so that at the end of a sinusoidal period, for example, the latched contents of the adder contains the integral of the squared input signal obtained over the signal's period.

It was noted in the previous section that for a passband attenuation of less than 1%, one had to restrict the signal bandwidth, $f_o$, to being less than $\frac{1}{13}$ of the first null frequency ($f_s/D$) of the running-averager's frequency response. For a 7-bit resolution, this gives a minimum sampling frequency, $f_s$, of $2^7 \times 13 = 1664$ times the signal frequency. Choosing $f_s=4096 f_o$ (i.e. $|H(f_o)|=0.9984$) and a 7-bit counter for the running-averager are then, more than adequate parameters to obtain the desired resolution of +/−1%. This is confirmed from simulations. The resulting computing error as a function of the input amplitude is shown by the graph in FIG. 25. One notes from this graph that the performance is similar to that of the mixed squaring scheme, while using only $\frac{1}{8}$ as many samples. For a 60 Hz input signal, for example, the DSM would only be required to run at 490 kHz making this scheme extremely practical to implement. Hence, the multi-bit modulated squaring scheme proves to be the optimum squaring structure to implement on the front end.

Figure 25:
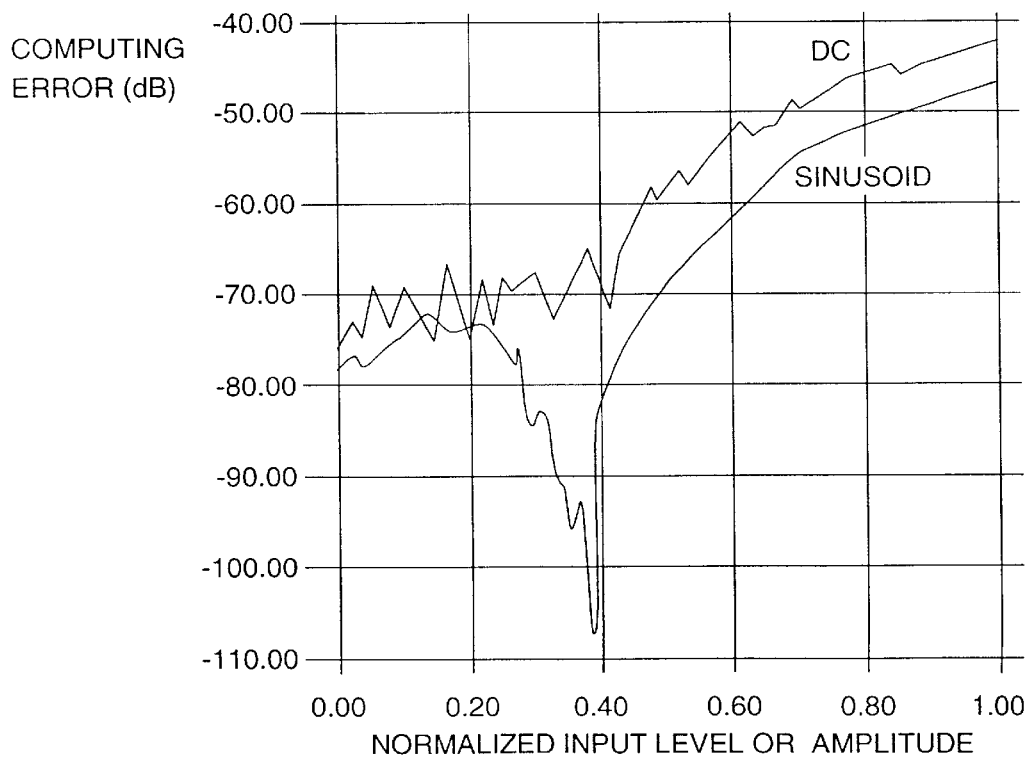
FIG. 25 depicts the error of the multi-bit modulated squaring scheme.
Figure 26:
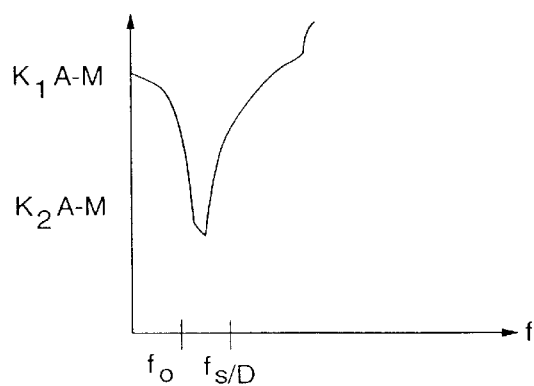
FIG. 26 depicts the frequency response of the DSM and running averager.
Figure 27:
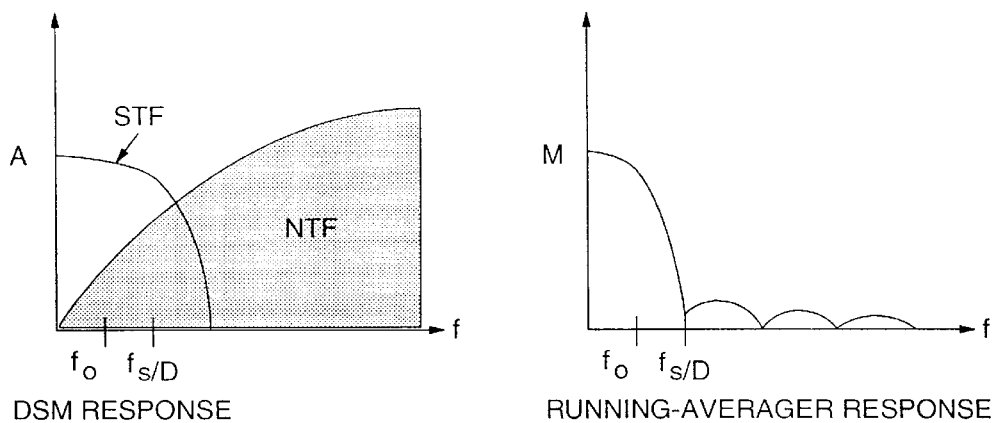
FIG. 27 depicts the spectral characteristics of the multi-bit modulated squarer output as a result of frequency domain convolution.
Figure 28:
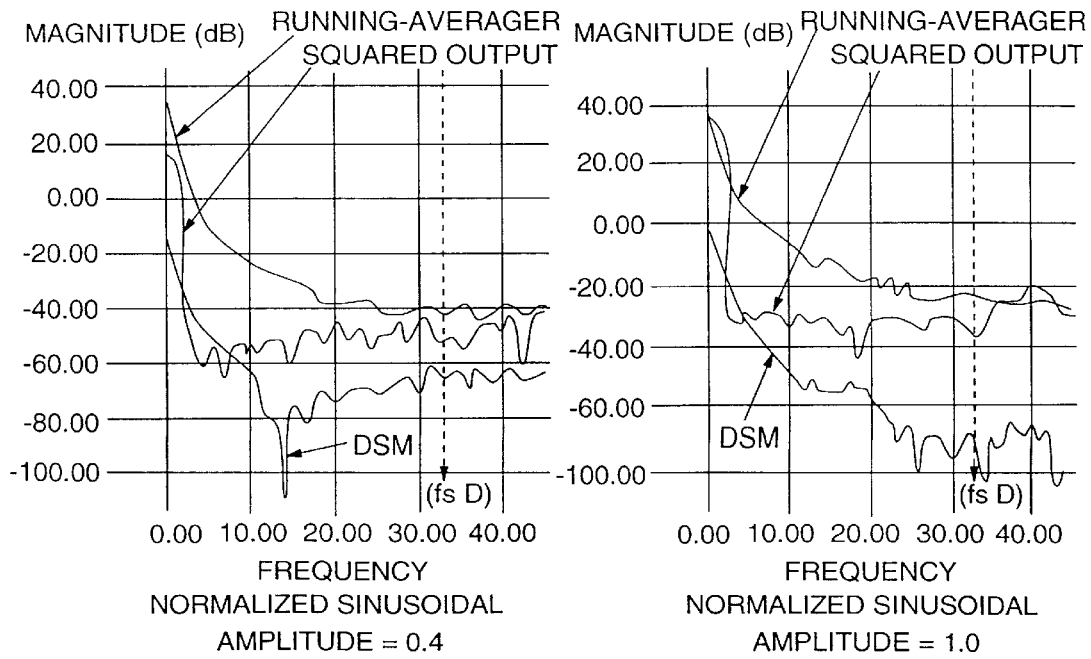
FIG. 28 depicts the spectral plot of signals in the multi-bit modulated squaring scheme for sinusoidal inputs.
Figure 29:
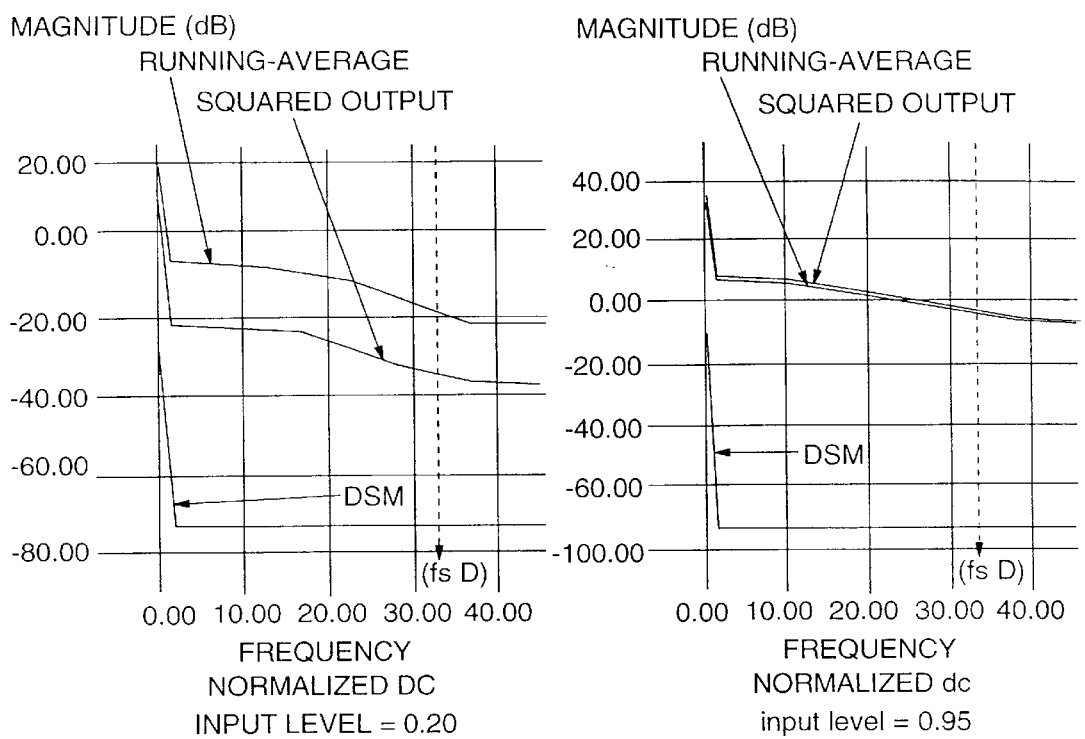
FIG. 29 depicts the spectral plot of signals in multi-bit modulated squaring scheme for dc inputs.

From the graph of FIG. 25, it is apparent that the computing error increases as the input signal level increases (except for the anomaly encountered with normalized sinusoidal amplitudes around 0.38). This is at first counter-intuitive and does not follow the probabilistic analysis initially presented. The behavior, however, can be understood if one analyzes it in terms of the frequency response of the various structures involved. In all the squaring schemes studied so far, the DSM and running-averager are used and both these elements have low-pass signal transfer functions (STF). In case of the DSM, it also has a high-pass noise transfer function (NTF). The resulting shapes of the frequency response for both the DSM and running-averager are shown in FIG. 27. Since a time domain multiplication of the DSM bit-stream and the running averager word is done, this means that the resulting frequency response is the convolution of the two input frequency response. Once can see that the resulting frequency response results in a noisier spectrum in the passband and that this characteristic gets worse as the two amplitudes, A and M, get larger. This is illustrated in FIG. 26. Fourier Transforms of the signals obtained from simulations of the multi-bit modulated squaring scheme confirm this analysis as shown in FIG. 28 and 29. In addition, they also confirm that the computing error for dc inputs is worse than that for sinusoidal inputs. This is because the dc inputs have larger values for A and M and hence, cause more of the noise to be aliased into the passband. As far as the anomaly encountered with sinusoidal amplitudes around 0.38 is concerned, one can only surmise that the enhanced performance results due to a higher degree of correlation that exists between the DSM bit-stream and the running-averager's output under the given conditions. This characteristic also appears to be controlled by the bandwidth of the running-averager circuit, since the notch occurs at higher amplitudes and is less pronounced as the sampling frequency (and hence OSR) is increased or the size of the latency is decreased. In other words, the notch occurs at higher input amplitudes as the bandwidth of the running-averager circuit is increased. A detailed study of this behavior was not carried out and, hence, may be considered a topic for future research. It was also found that increasing the order of the DSM used did not improve the overall performance of the squaring function, since the output of the higher order DSMs have a larger noise spectrum outside the passband. This larger noise spectrum gets aliased into the passband when the multiplicative process is carried out, resulting in a degradation in performance. Hence, the use of a simple first-order DSM based ADC still appears attractive.

Figure 30:
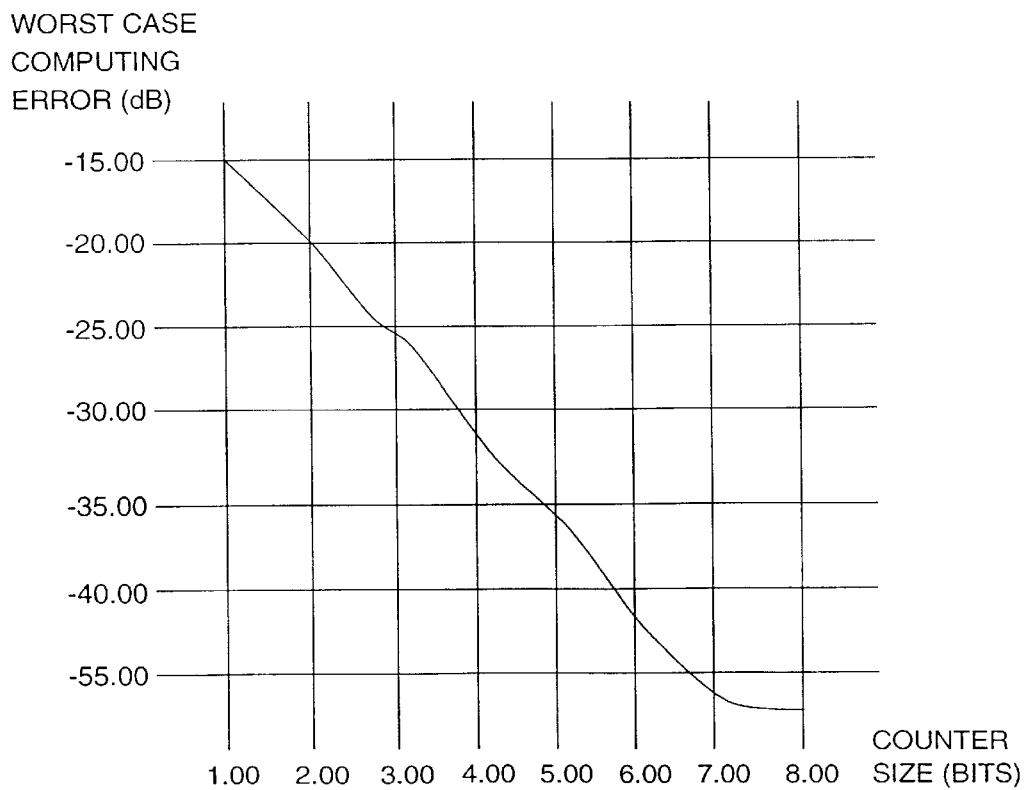
FIG. 30 depicts the computing error as a function of counter size for a mixed squaring scheme.

From the above frequency domain analysis, one may postulate that a similar explanation can be given for the behavioral characteristics of the mixed or fully stochastic squaring schemes. The bit-streams are filtered by the DSM and the running-averager circuit so that convolution of the DSM bit-stream with itself or with the running-averager's output results in increased computing error as the input amplitude is increased. Since increasing the size of the counter in the running-averager narrows the bandwidth of the structure, one wood expect the computing accuracy to improve for increased counter sizes. This idea is confirmed by simulations conducted on the mixed squaring scheme for various counter sizes and the results are shown in FIG. 30. In all cases, the worse case error (defined as the maximum computing error observed over the entire input range) occurred when the input amplitude approached the full-scale value.

From the simulations conducted on the squaring schemes of this section, it becomes apparent that the actual architecture used plays a major role in the distribution functions assumed by the bit-streams and hence, the overall accuracy of the computation. The probabilistic models developed previously for stochastic computing functions in do not take into account the implementation technique used and consequently serve only as an initial design guideline.

Square-Root Function

Figure 31:
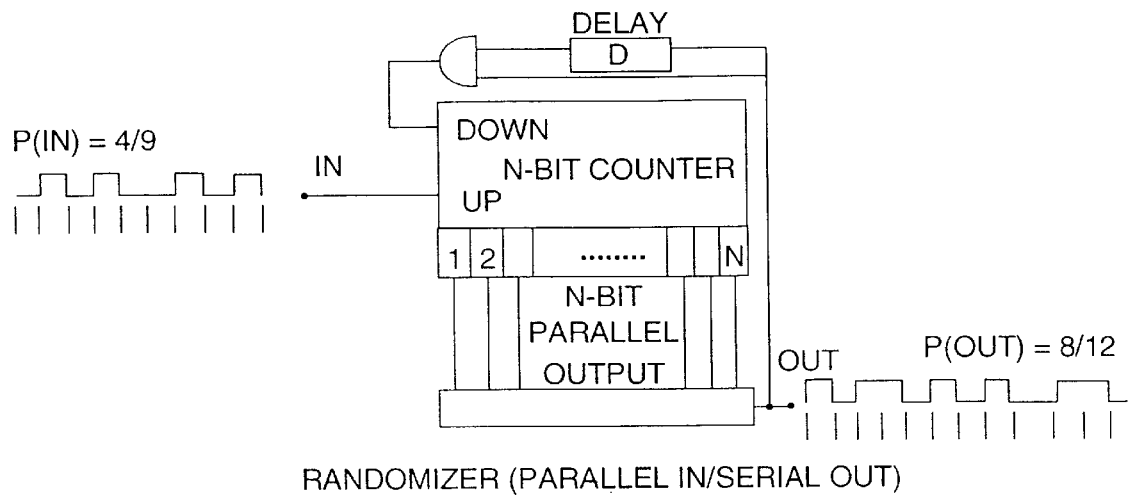
FIG. 31 depicts a stochastic square rooting scheme.

For convenience, FIG. 31 shows the circuit scheme used once again. In an RMS function, such a square-rooting circuit would be used directly on a probabilistic bit-stream representative of a dc value as will be shown in the next section. As such, the scheme discussed previously is more amenable to being implemented. This is because a probabilistic bit-stream is easily generated from the contents of a register, in contrast to the DSM based conversion that is required if an analog signal is to be operated upon.

As mentioned previously, the ADDIE size, n, and the sampling frequency, $f_s$, used play an important role in determining the accuracy and bandwidth of the resulting configuration. The bandwidth (time-constant) of the ADDIE in this case, determines the speed of the feedback loop, since too large a counter means that the response time to correct the counter contents is slowed down. This is analogous, once again, to an analog implementation where the open-loop gain of an operational amplifier essentially determines the tracking capability of its positive and negative terminals when negative feedback is incorporated. The feedback squaring loop uses the fully stochastic squaring scheme where, the delay, D, used to decorrelate the two inputs to the AND gate, also plays a role in determining the accuracy. The delay required depends on the sample size used and it increases as the sample size is increased. This is because the cross-correlation between the delayed and undelayed bit-stream rolls off more slowly as the sample size is increased. However, too large a decorrelating delay can result in the delayed bit-stream reflecting an old ADDIE value and thereby reduce the effectiveness of the negative feedback loop. Hence, an optimum value for the decorrelating delay and ADDIE size is required for a given sampling frequency (sample size).

Figure 32:
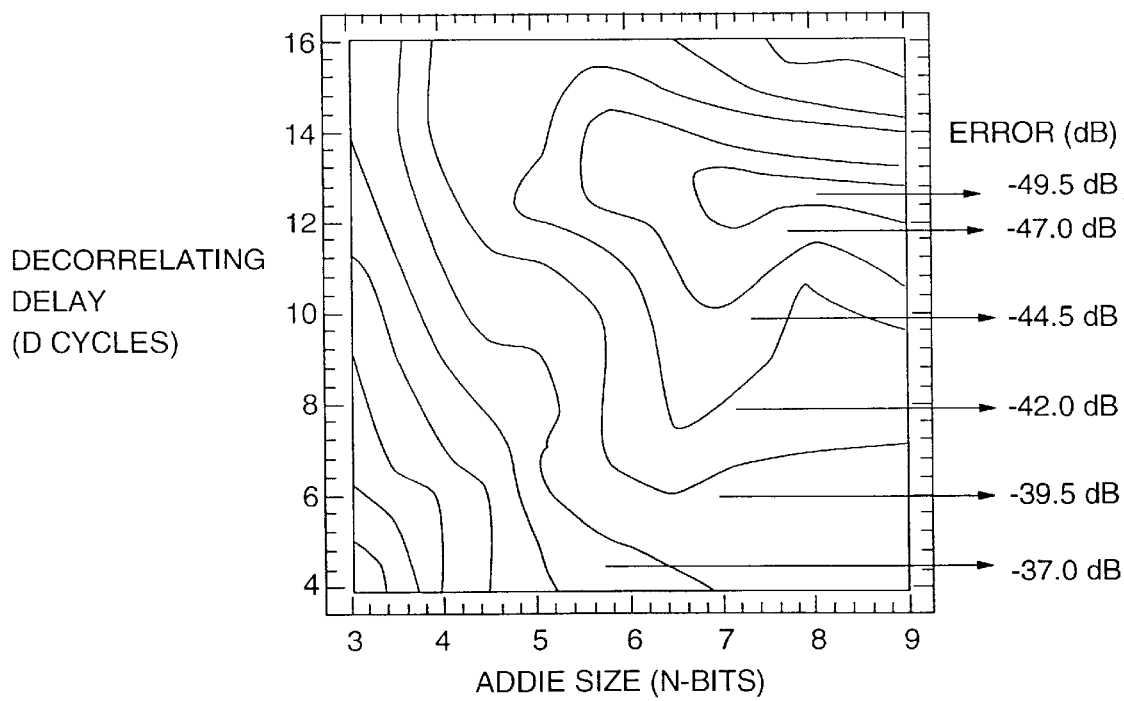
FIG. 32 depicts a contour plot of computing error as a function of n and D for the stochastic square-rooting scheme using a sample size of 32k.
Figure 33:
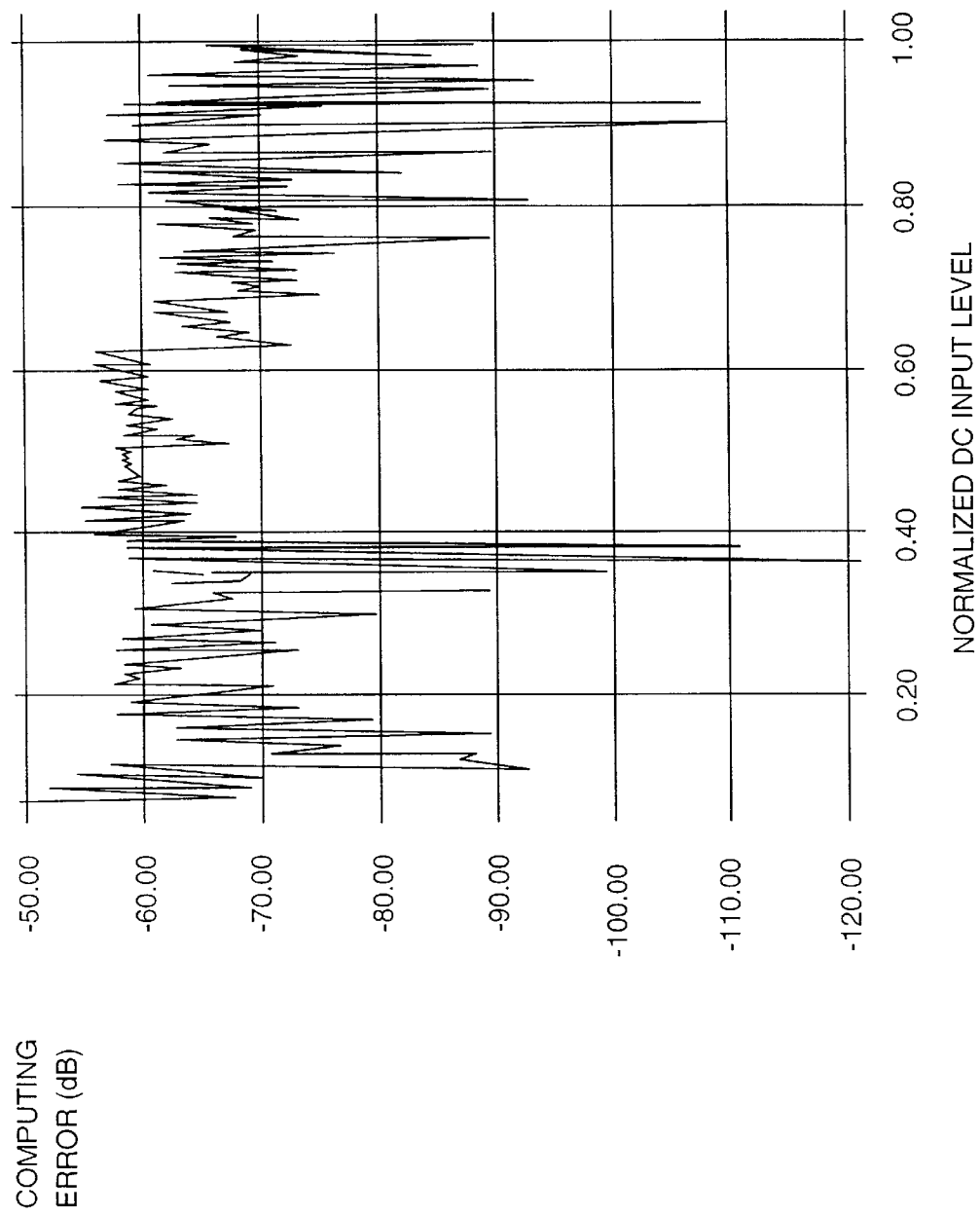
FIG. 33 depicts the computing error for stochastic square rooting using n=7 and D=12 with a 32k sample size.

A parametric simulation of the computing error as a function of the ADDIE size, n, and decorrelating delay, D, used, was therefore conducted. The simulation was conducted by performing the computations on a probabilistic bit-stream generated from a 15-bit randomizer that represented a do value ranging from 0.1 to the full-scale normalized value of 1. A 32K ($2^{15}$) sample size was used for each of the parametric conditions tested. It may be noted that the clocking frequency used is not impractical, since the entire circuit is implemented in digital logic. FIG. 32 shows the results obtained, by displaying the worst case computing error as a function of the two parameters, n and D. These results show that there is an optimum design parameter that can be chosen to obtain the best computing accuracy. For the parameters used in the simulation, the smallest worst case error is obtained when the ADDIE size is 7-bits and the decorrelating delay is 12 cycles. The computing error as a function of the input level is shown in FIG. 33 for this optimum parameter.

Root-Mean-Square Function

Root-mean-square measurements are very useful in power conditioning circuits as they can be used as a threshold detection scheme for ac signals. They can also be incorporated into more complex computations like power-factor (PF) is:

$$PF = \frac{\text{Power}_{Real}}{\text{Power}_{Apparent}} = \frac{(V \times I)_{avg}}{V_{RMS} \times I_{RMS}} \quad (3.3)$$

In addition to the practical uses for RMS measurements, the RMS operation is also a good representative mathematical operation to illustrate the versatility of the computing blocks developed so far. RMS measurements on any signal need to be carried out in two steps. The first step consists of squaring the input signal as it is being sensed and averaging the result over the signal's period. The second step requires the square-root of this averaged result to be found. Mathematically, the RMs value of a signal V(t) with period T can be defined as:

$$RMS = \sqrt{\frac{1}{T} \int_0^T V(t)^2 dt} \quad (3.4)$$

It may be noted that in typical power signals, such as the 60 Hz ac power line, the signal is symmetric about the x-axis and hence, only half (or a quarter for a sine wave) the period needs to be used in the computation. This decreases the computation time required and also allows for the rectified version of the input signal to be used.

Figure 34:
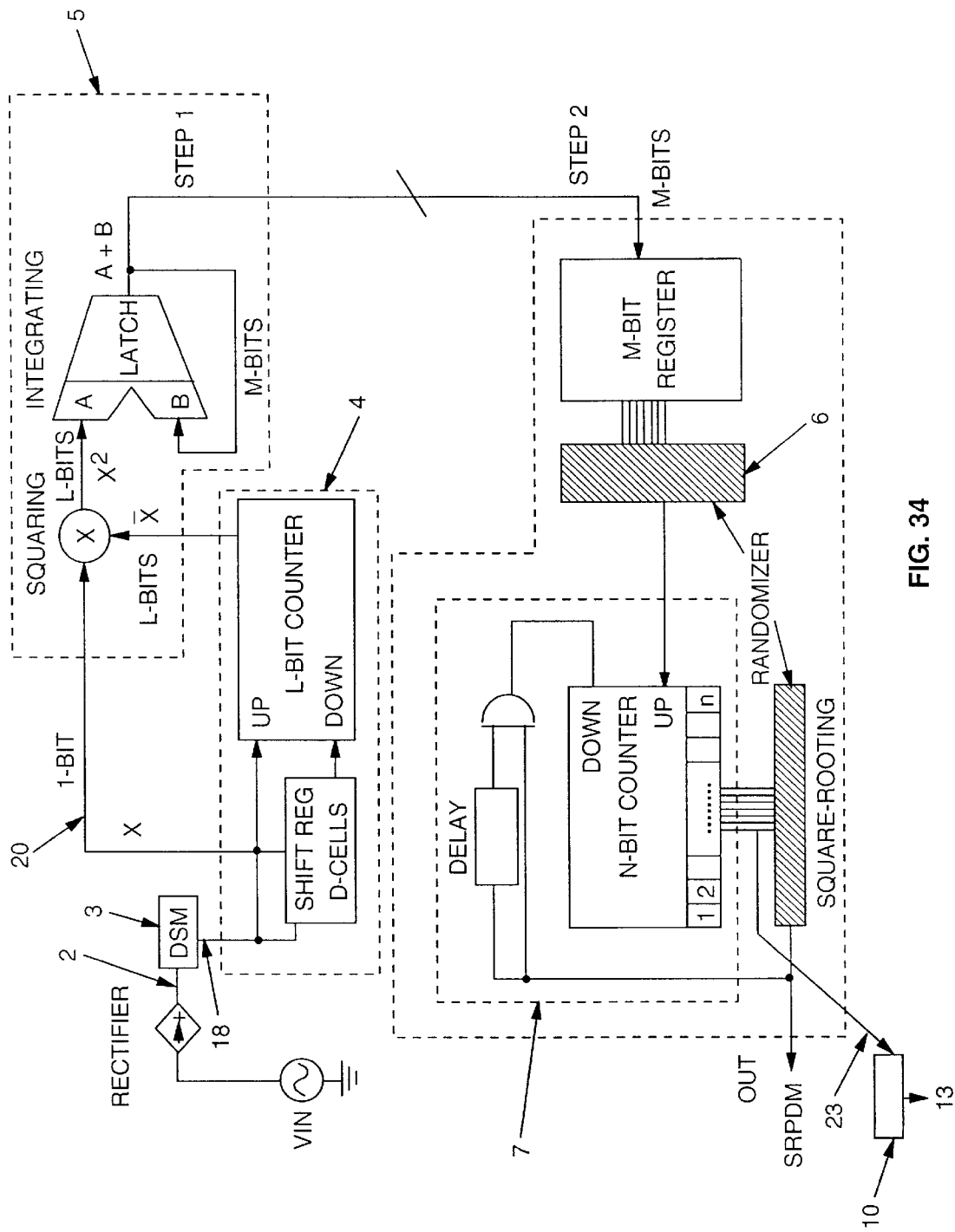
FIG. 34 depicts the RMS processing measurement scheme.
Figure 35:
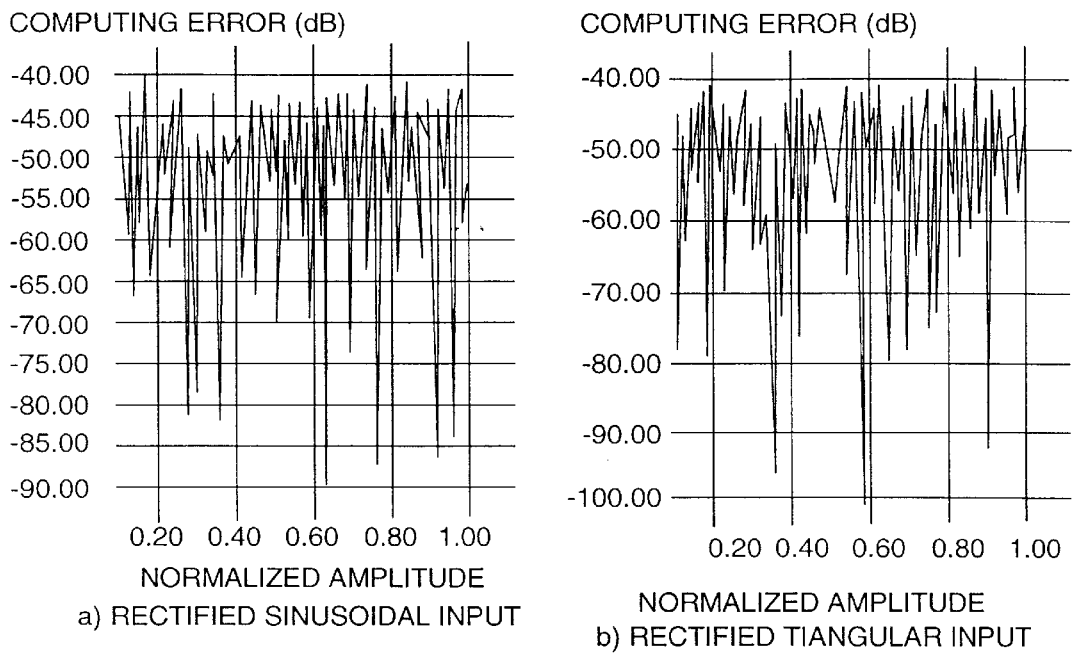
FIG. 35 depicts the computing error of the RMS measurement scheme.

The previous three sections developed optimum structures for all the fundamental computing blocks are required to implement the RMS function. The final RMS function can, hence, be devised as shown in FIG. 34 using the optimum squaring, and square-rooting schemes developed. Simulations were conducted using rectified sinusoidal and triangular input waveforms, and the DSM using an OSR of 4096 (running-averager uses 7-bit counter). The square-rooting operation used 32,768 points per computation. The results of this simulation are shown in FIG. 35 in terms of the computing error are various input amplitudes. It can be seen that the computing error is less than −40 dB (or +/−1%) over the full input amplitude range and, therefore, the design meets the measurement criteria set.

Figure 36:
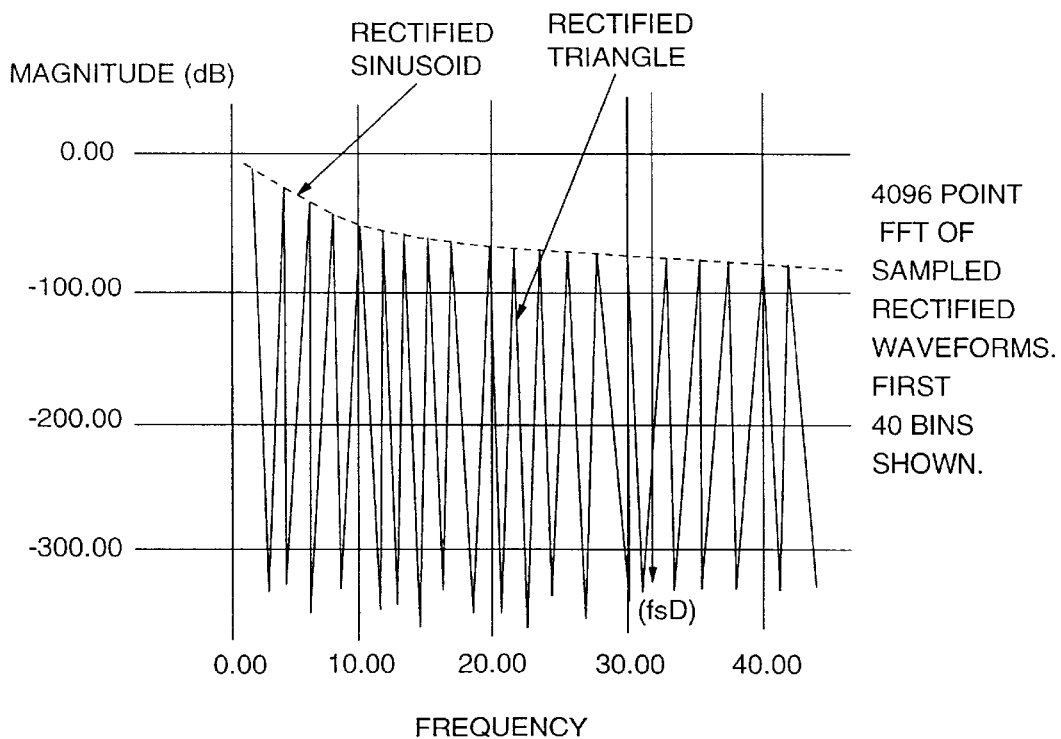
FIG. 36 depicts the spectral distribution for rectified sinusoidal and triangular waveforms.

The accuracy of the RMS circuit depends on the bandwidth of the input waveform. Since the sampling frequency and size of the running-averager determine the bandwidth of the circuit, one needs to be wary of the signal's spectrum being affected by the filtering of the running-averager. Rectification of the input signal also changes the input spectrum. In the case of the rectified sinusoidal and triangular inputs, the spectra are similar in their spread and hence, the computing error is almost identical for both types of inputs. FIG. 36 shows the spectral distribution for the rectified sinusoidal and triangular inputs.

The bandwidth of the RMS circuit also determines the crest factor (CF) obtained. The CF is defined as the ration of the peak value of a waveform to its RMS value. For example, the CF for a sinusoid is √2 and that for a triangular waveform is √3. Commercial analog RMS meters, such as the HP-3400A, have crest factors as high as 10. In this RMS scheme, however, the circuit bandwidth limits the CF obtained. Since the OSR used was based on the spectra of the sinusoidal and triangular inputs, input waveforms with higher frequency spectral content are attenuated by the circuit's inherent low-pass filtering characteristics. This gives this RMS circuit a very low CF of √3, as noted from simulations. A higher CF may be obtained by increasing the bandwidth of the circuit at the expense of resolution as was discussed earlier. For the given design, however, the low CF is advantageous when the circuit is to be operated in a noisy environment such as that of a high voltage switched-mode power supply.

DMS Based ADC

The design of DSM based ADCs requires a number of factors to be taken into account in order to obtain optimum results in terms of SNR, dynamic range and circuit size. This section will give a brief outline of some of the factors that were considered during the design of the first-order DSM with two-level quantization.

Since an analog external signal that needs to be processed requires an ADC on the front end, the overall layout area of the ADC plays an important role in determining the cost effectiveness of the system. Implementations that take advantage of existing CMOS VLSI technology are, therefore, the preferred choice. As a result, switched-capacitor design techniques were used because of ease of integration in CMOS technology.

Figure 37:
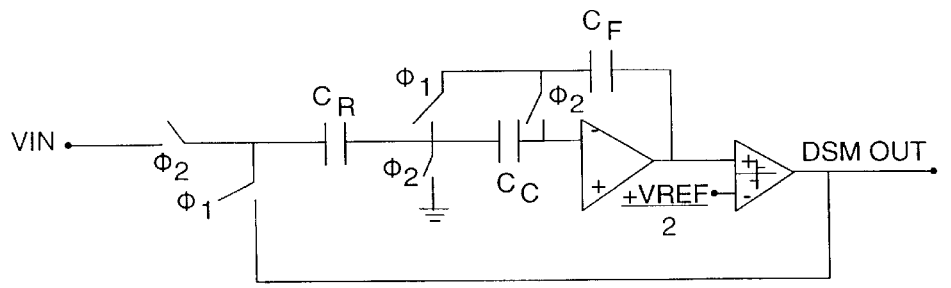
FIG. 37 depicts a stray insensitive offset compensated single ended DSM circuit.

CMOS implementations, however, are known for offset-voltage problems and this can limit the final performance of a circuit. For example, an offset-voltage in the integrator of the DSM will introduce an error in the output bit-stream representation and also limit the dynamic range of the input signals allowed. Hence, circuit techniques that compensate for offset-voltages in the DSM's integrator are necessary. The configuration for a stray-insensitive offset-compensated (OC) circuit was therefore used. The resulting DSM circuit is shown in FIG. 37.

Since the signal processing schemes were developed for unipolar signals (bipolar source signals are rectified to obtain a unipolar swing), the ADC only needs to represent unipolar analog signals. Hence, the two level quantizer or comparator in the DSM can use zero Volts and some positive reference voltage as the two levels of representation. Five Volts was chosen as the positive voltage level so that the ADC could be interfaced to conventional digital processing circuits. This also means that input voltages in the range of zero to five Volts could be represented by the ADC. Input signals exceeding 5 Volts needed to be scaled before being fed to the DSM.

In order for the DSM to operate satisfactorily, the integrator in the DSM should not saturate. Simulation studies show that the integrator voltage rails need to be twice as large as the maximum input voltage used in order to ensure that saturation does not occur. The integrator was, therefore, made to operate from +/−10 Volt supply rails. (It was also found that an integrator rail voltage of four times the maximum input voltage would be required if bipolar input signals were to be used.)

The characteristics of the operational amplifier play an important role in determining the overall performance of the DSM. It has been found that the signal to noise ratio (SNR) of the DSM degrades when the oversampling ratio (OSR) exceeds the open-loop gain of the amplifier. Furthermore, the performance of the offset compensated circuit depends on the gain of the amplifier as well. The amplifier's bandwidth, in turn, determines the maximum sampling frequency and slew rate that can be afforded. Hence, it was important to ensure that these parameters were taken into account when designing the DSM. The LM833 amplifier used had a voltage gain of 110 dB and the multi-bit modulating squaring scheme allowed the use of an OSR of only 4096 (in contrast to OSRs of 32K for stochastic squaring schemes). These two parameters, therefore, ensured that the DSM operated within the limitations of the amplifier.

Parasitic effects due to switch capacitances needed to be taken into account as well. Clock feedthrough and charge injection play a major role in limiting the performance of the DSM. In order to achieve small circuit sizes it is desirable to use minimum capacitance values and keep the capacitance spread (for example, $C_F/C_R$) close to unity. Small capacitance values also demand less current from the amplifiers for a desired slew rate. However, clock feedthrough and charge injection effects get worse as capacitance values get small. For the discrete implementation, a capacitance value of $C_F=C_R=330$ pF was empirically found to give the optimum performance. The use of complementary switches helped improve the performance as well, since the complementary clock voltages aided in alleviating the clock feedthrough effects and reducing the switch resistance for input voltages at either end of the signal range. Such complementary switches were made available by using the analog transmission gate switches provided commercially by Motorola's HC4066 analog switch.

Figure 38:
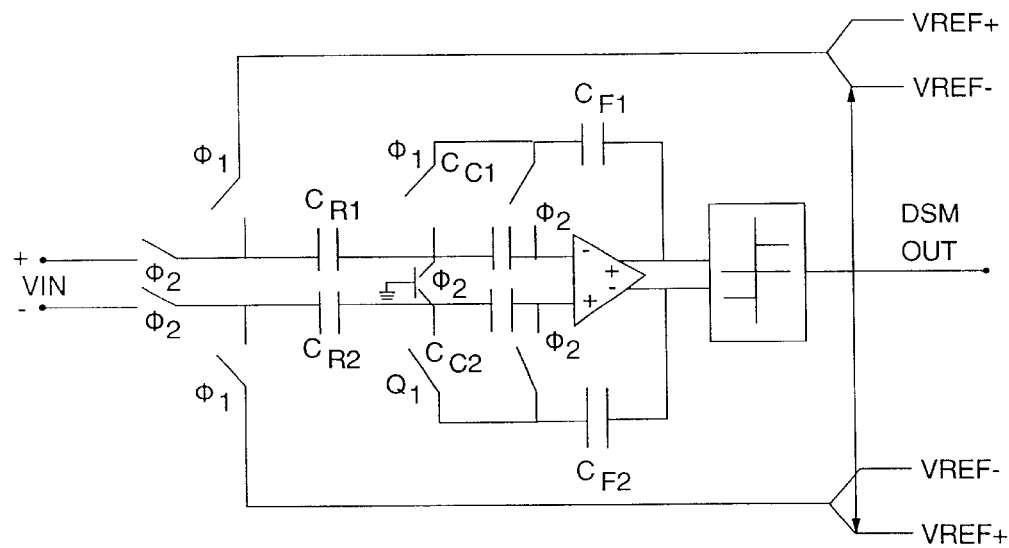
FIG. 38 depicts a differential structure of a stray insensitive offset compensated DSM circuit.

In general, differential circuit structures can be used to mitigate the problems caused by clock feedthrough, charge injection and power supply noise. This is because the complementary structures (assuming they are identical) result in the cancelling of what becomes common-mode noise. This enhancement in performance, however, comes at the expense of almost doubling the circuit complexity as shown in FIG. 38. Due to the added wiring complexity, the differential circuit was not used in the implementation. The use of such a circuit is, nevertheless, highly recommended when one proceeds with a VLSI implementation of the ADC.

The above issues were considered when building a prototype in the form of a discrete component DSM based ADC, so that a reasonable idea of the circuit complexity and size could be obtained in a VLSI implementation. It should be noted, however, that extensive literature on the optimization of DSM designs exist.

Threshold Detection Circuit

In this implementation, the threshold detection circuit consisted of the DSM based ADC on the front end, and the FPGA implemented running-averager scheme described previously. The running-averager scheme allowed for the circuit to be designed without the use of control circuitry that would typically be required in a conventional "accumulate and dump" decimation circuit. In this implementation, the circuit was used simply as a voltmeter for observation since the actual threshold decision circuitry is simple for a person skilled in the art to implement and the values used are system dependent.

In a convenient implementation a running averager used in a supervisory circuit can call Up addresses in a ROM containing data identifying whether the address value corresponds to valid, marginal or invalid signal levels. In this embodiment, the BCD can be replaced by a binary counter, the contents of which are used to address a ROM containing user specified threshold values.

Figure 39:
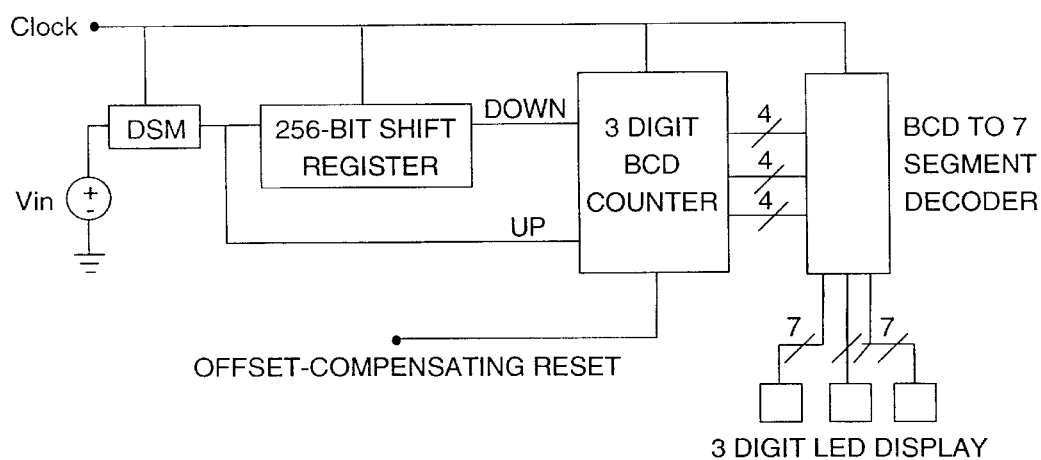
FIG. 39 depicts a block diagram of a voltmeter circuit.

For a display to observe the embodiment of the invention studied, an 8-bit voltmeter was implemented by using an input latency of 256 bits. A three digit binary coded decimal (BCD) Up/Down counter was used to accommodate the 8-bit quantity, with the DSM bit-stream being fed to the Up input and the 256-bit delayed version being fed to the Down input of the counter. A BCD to 7-segment display decoder was then used to obtain a digital readout of the counter's contents. Since the DSM was designed to operate with an input ranging between zero and five volts, a reading of '256' on the digital display corresponded to the full scale input voltage of 5 volts, while a reading of '000' corresponded to an input voltage of 0 volts. A reading of '256' is possible since a BCD counter capable of counting up to '999' was used. Input voltages between zero and five volts were appropriately scaled, with a 2.5 volt input being displayed as '128', for example. FIG. 39 shows the block diagram of the voltmeter circuit. Since the counter updates at the same rate as the DSM, both systems shared the same clock. The shift register or latency block had a separate RESET line from that of the counter, however, as this allowed for offset voltages from the source to be nulled or cancelled in the counter. Hence, dc offset-compensation was digitally achieved following the DSM stage.

Root-Mean-Square Circuit

The RMS circuit was designed to operate on a rectified ac signal, taking advantage of the fact that the signal is symmetrical about the x-axis. A full-wave rectifier circuit was therefore required, in order to be able to use the unipolar ADC and signal processing schemes developed. A "super-diode" based full-wave rectifier, was hence built, in order to ensure that the rectified signal was not distorted from the forward voltage drops of the rectifying diodes. A zero-crossing detector (ZCD) was also used so that the mean-squared value could be properly evaluated over the signal's period. The ZCD was implemented using a hysteresis of 500 mV.

The processing circuit for the RMS evaluation was based on the multi-bit modulated squaring and stochastic square-rooting schemes. As mentioned earlier, the RMS measurement is carried out in two steps. The first step consists of evaluating the mean-squared value of the signal over half the signal's period (since the signal is assumed symmetrical about the x-axis). The second step consists of calculating the square-root of the mean-squared value obtained. A synchronous state machine (SM) was designed to control and direct the RMS computation. The state diagram for this controller is shown in FIG. 40.

Figure 40:
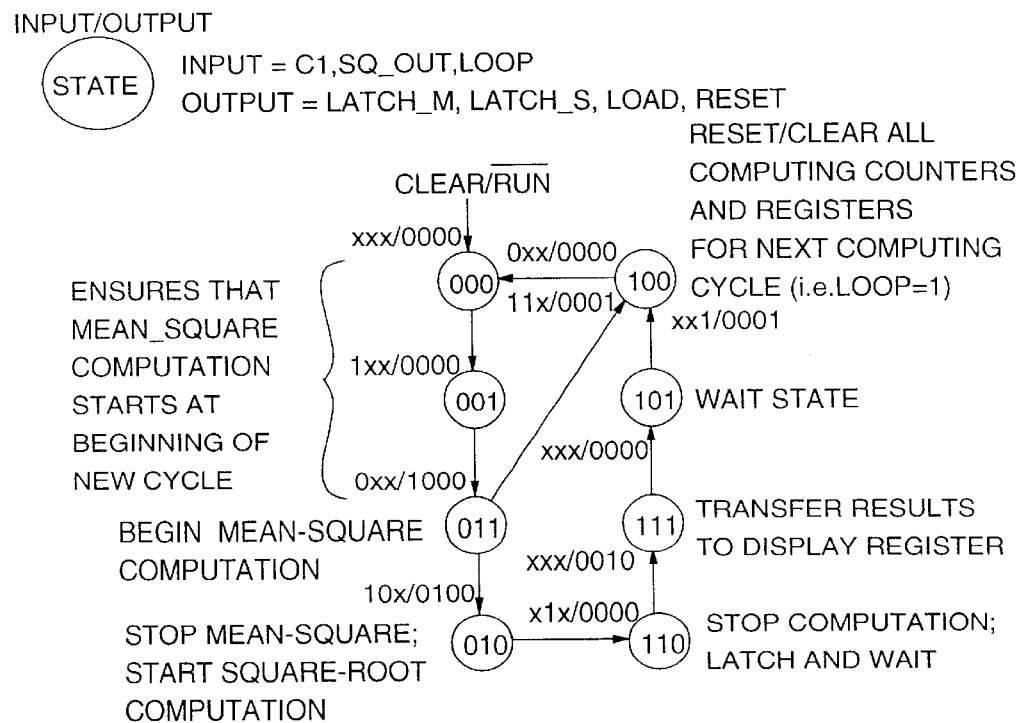
FIG. 40 depicts a state diagram for the RMS controller.

FIG. 40 only shows the input conditions under which a state transition occurs. This was done in order to highlight the main flow of operation and ensure the readability of the diagram. The controller used three inputs to determine which state the processor should be in. These three inputs were:

(i) C1=$\overline{\text{RUN}}$ AND ZCD (where $\overline{\text{RUN}}$ is the user controlled start switch and ZCD is the output of the zero-crossing detector)
(ii) SQ_OUT=Time-Out of 32K counter/timer (controls the sample size for square-root operation)
(iii) LOOP=Measurement mode; allows either one-shot or continuous monitoring mode These three inputs along with the machine's state determined the SM's outputs. The four controlling outputs were:

(i) LATCH_M=Enables accumulation of the squared signal value for mean-square evaluation
(ii) LATCH_S=Enables 32K counter/timer and the accumulation of the square-rooted bit-stream in a BCD counter for display purposes
(iii) LOAD=Loads contents of the BCD counter into the display register
(iv) RESET=Resets all counters, timers and registers except the display register, in preparation for the next evaluation In terms of the actual computing structures involved, one recalls that the optimum parameters for the RMS scheme (shown in FIG. 34) were developed to obtain a full-scale computing error below −40 dB. This performance was achieved by using an OSR of 4096 for the DSM and a running-averager with a 7-bit counter in the squaring step. The mean-square evaluation, therefore, required a 19-bit accumulating adder to be used (recall from FIG. 24 that $M=\log_2(OSR)+L$). Also, the mean-square evaluation was conducted at the same rate as the DSM sampling rate. For the square-rooting step, a 7-bit ADDIE using a decorrelating delay of 12 cycles and a 32K (K=1024) sample size per computation were required. This sample size required that the square-rooting block run on a separate and faster clock than the mean-square and DSM blocks. Hence, the actual implementation operated on two clocks with the slower clock (labelled 'A Clock' in FIG. 42) being used to run the ADC and mean-square operations, while the faster clock (labelled 'D Clock' in FIG. 42) was used to run the stochastic square-rooting operation.

The multi-bit modulated squaring was performed by feeding each of the 7 bits of the running-averager to an AND gate with the other input of each of the AND gates being tied together and connected to the DSM output. The resulting outputs of the AND gates were, therefore, a modulated version of the running averager's 7-bit word. This modulated word was then fed to the accumulating adder circuit to obtain the mean-squared value. The mean-square operation was conducted over half the signal's period, as mentioned earlier.

For the square-rooting operation, two randomization techniques were used for the generation of the probabilistic bit-stream. The variable probability generator, described previously, was used to randomize the contents of the accumulator after the mean-square operation while the comparator based scheme shown in FIG. 14 was used to randomize the counter contents of the square-rooting ADDIE. Both these techniques required a pseudo-random noise generator and hence, a 16-bit LFSR was implemented in the FPGA.

Figure 41:
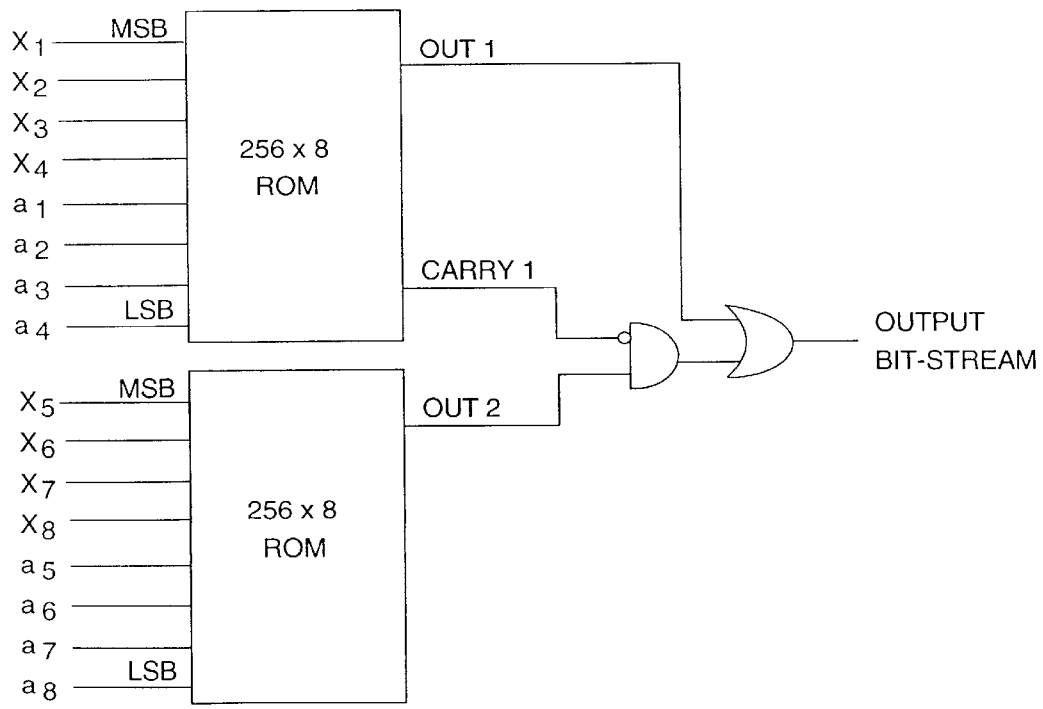
FIG. 41 depicts the implementation of the ROM based randomizer.

The 16-bit size was chosen so that the limit-cycle of the LFSR (64K cycles) exceeded the computing time of the square-root operation (32K cycles). As an interesting aside, the LFSR structure was built using EXCLUSIVE-NOR gates instead of EXCLUSIVE-OR gates, to accommodate the fact that all registers in the FPGA are cleared to zero upon power-up. The variable probability generator circuit was then designed in an arrangement that used an external set of ROMs as a look-up table. These ROMs used the output from the LFSR registers as the least significant set of address lines while using the contents of the mean-square accumulator as the most significant set of address lines. The ROM was then programmed to contain data that would reflect the logical operations discussed previously (FIG. 18), whereby, the accumulator contents acted as the weighting coefficients, $x_i$, and the LFSR bits acted as the noise bits, $a_i$. Two data bits were used for each combination of address inputs. One data bit carried the logical outcome of the address combinations, while the other bit (carry bit) was used to represent the event when all $a_i$ were zero. The use of two data bits allowed for the cascading of two or more ROMs for use in the randomization of larger binary words. This is illustrated by the example shown in FIG. 41 where the contents of an 8-bit counter are randomized using two 256 byte ROMS. For the square-rooting operation, the 16 most significant bits of the mean-square accumulator contents were used for randomization (all 19 bits were not used in order to reduce the component count; this introduces negligible error). This meant that 16 weighting bits and 16 noise bits were required to obtain the randomized version of the accumulator's contents. Using a 64K ROM, however, only allows 16 address lines per ROM. Hence, two '64K×8' ROMs were combined in an arrangement similar to FIG. 41, in order to obtain the probabilistic serial output representing the 16-bit word. It may be noted that the randomizer could have just as easily been implemented inside the FPGA using simple logic. This method of implementation was used simply as an exploratory approach and also to allow the FPGA logic to be used more productively for other functions.

Referring to the visual display, to obtain a readout of the RIAS value, the bit-stream generated by the squarerooting ADDIE was accumulated in a 5-digit BCD counter and then transferred to a display register. The contents of the display register were then fed to a 7-segment display decoder which in turn was used to drive a 5-digit decimal LED display outside the FPGA. The RMS value was displayed as a decimal number ranging from 0 to 32K, where 32K represented the full scale input level. In other words, if a sinusoidal waveform with an amplitude of 5 Volts (5 Volts= full-scale input level) were to be used as the input signal, then the RMS value displayed would be, $$\frac{5/\sqrt{2}}{5} \times 32{,}768 = 32{,}768/\sqrt{2} = 23170$$

since the normalizing factor for the input signal is 5 Volts and the normalizing factor for the display is 32K.

Figure 42:
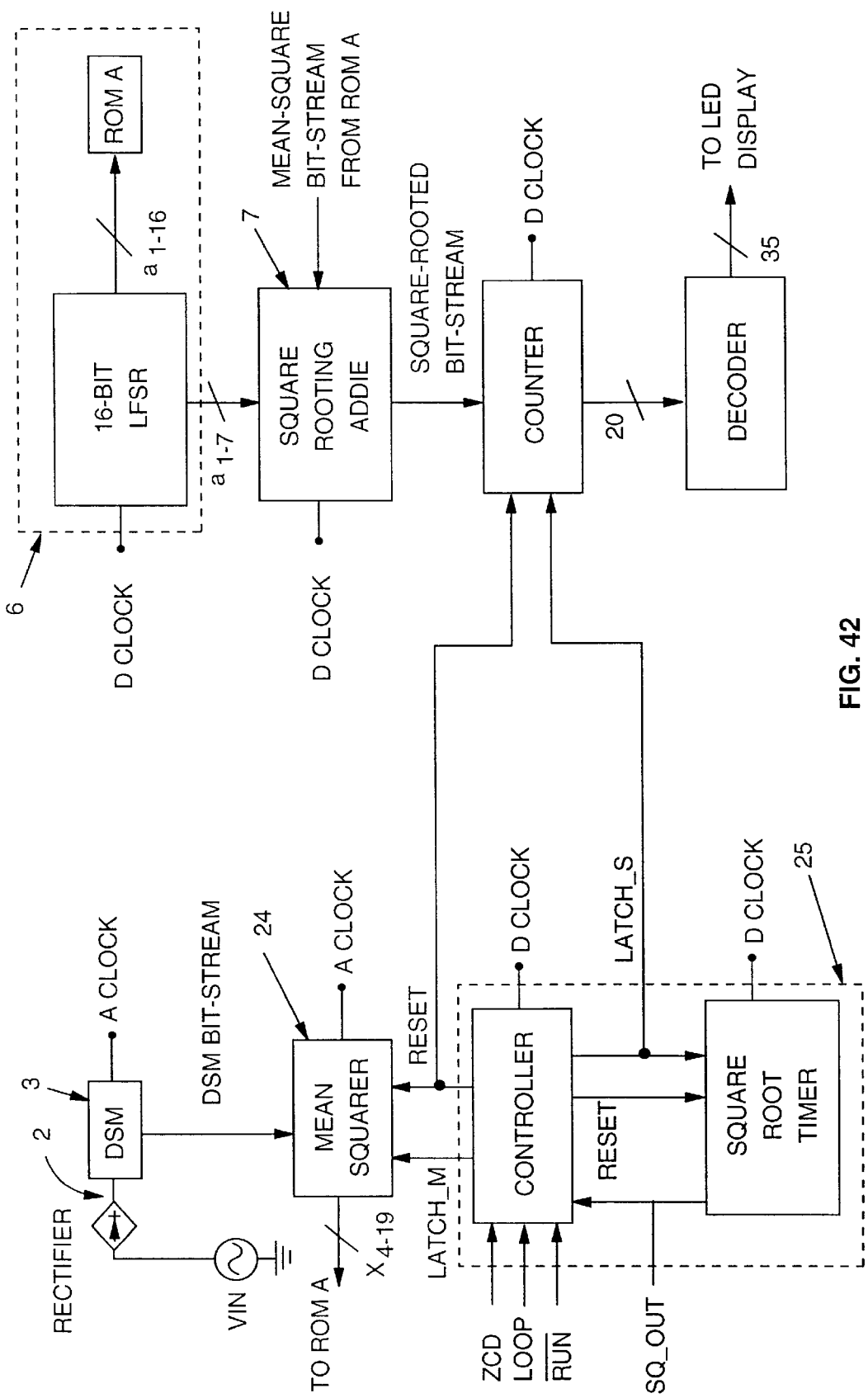
FIG. 42 depicts a functional block diagram of one embodiment of the RMS circuit.

FIG. 42 shows the functional block diagram of the overall RMS circuit. The resulting implementation of the RMS circuit was arranged so that most of the signal processing functions were carried out within the FPGA. Overall, the implementation allowed the circuit to be used as a convenient true RMS voltmeter with the option of using it in either a one-shot or continuous monitoring mode.

Supervisory Circuit Layout

Figure 43:
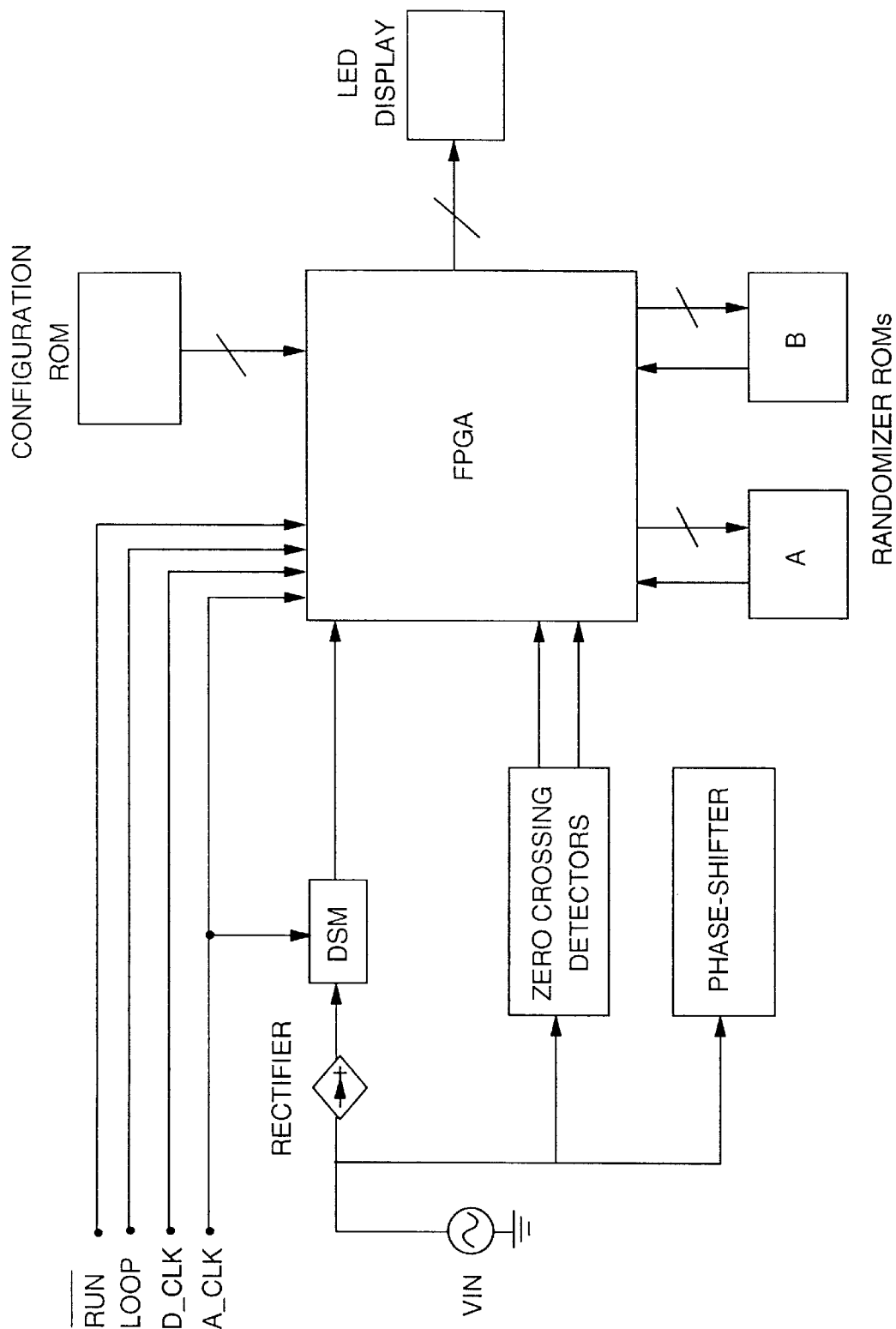
FIG. 43 depicts a generic layout for the supervisory circuit.

The previous three sections showed how most of the signal processing functions were carried out within the FPGA. Analog functions such as the DSM based ADC, and ZCD along with some minor logic were the only circuits to be implemented external to the FPGA. Most of these external circuits, however, were used in all the supervisory functions. This allowed a generic layout to be obtained, whereby, a single configuration ROM (determined the supervisory function of the setup, as was indicated previously. FIG. 43 shows the generic layout for one embodiment of the supervisory circuit. The overall implementation illustrates that the concepts and circuits used in the process of designing the supervisory functions lend themselves to a layout or structure that can be easily reconfigured to accommodate new or updated signal processing requirements. It should also be pointed out that the randomizer ROMs, shown in FIG. 43, could have easily had their functions integrated within a larger FPGA structure, leaving only simple analog circuits external to the FPGA.

Area Estimates

The design and hardware implementation of the computing structures allowed for a fairly reasonable estimate to be made with regards to the core area that may be occupied in silicon or the number of transistors that may be required in the integrated implementation of the supervisory functions. The figures obtained can in turn be used to determine the feasibility of a silicon implementation or its attractiveness in terms of the core area occupied. It was hence found that in 1.2 $\mu$m CMOS technology, a DSM based ADC using a differential based circuit structure occupies an area of approximately 0.10 mm².

The sizes for the digital signal processing supervisory functions were evaluated in terms of the number of transistors that each function required. Table 4.1 lists the number of transistors found to be required by each function along with an estimate of the core area that will be occupied. It is interesting to note that the estimates show the variable probability randomizer circuit to require only about half as many transistors (and hence area) as that needed by the magnitude comparator based randomizing circuit.

This section dealt with the actual design and physical implementation of the threshold, mean-squared, and RMS circuits. Analog portions of the design were implemented using discrete components while most of the digital signal processing functions were implemented within a FPGA. The generic layout of the circuit allowed for a single configuration ROM to determine the supervisory function of the setup. The overall implementation also showed that the concepts and circuits used in the process of designing the supervisory functions, lend themselves to a layout or structure that can be easily reconfigured to accommodate new or updated signal processing requirements. Estimates of the area occupied by the DSM based ADC in 1.2 $\mu$m CMOS and the number of transistors required for the digital signal processing circuits were also made. The estimates obtained were attractive in terms of the area requirements, with less than 7,000 transistors being required for the implementation of the digital portion of all three supervisory functions.

TABLE 4.1

Transistor Count for Supervisory Functions

| Processing Function | Transistor Count | Estimated Core Area |
|---|---|---|
| 8-bit Voltmeter/Threshold Detector | 3458 | 0.33 mm² |
| 7-bit RMS Computation (includes running averager and means squarer | 6281 | 0.60 mm² |

What is claimed is:
1. A running averager processor comprising:
an (L bit) up down counter having incrementing and decrementing inputs, and an output;
said counter being adapted to be incremented by a serial pulse density modulated bitstream, and decremented by said bitstream delayed by a ($2^L$) shift register,
whereby the output of said up down counter represents the running average of said bitstream.

* * * * *